(12) United States Patent
Burak et al.

(10) Patent No.: US 9,083,302 B2
(45) Date of Patent: Jul. 14, 2015

(54) STACKED BULK ACOUSTIC RESONATOR COMPRISING A BRIDGE AND AN ACOUSTIC REFLECTOR ALONG A PERIMETER OF THE RESONATOR

(75) Inventors: Dariusz Burak, Fort Collins, CO (US); Stefan Bader, Fort Collins, CO (US); Alexandre Shirakawa, San Jose, CA (US); Phil Nikkel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1006 days.

(21) Appl. No.: 13/208,883

(22) Filed: Aug. 12, 2011

(65) Prior Publication Data
US 2012/0218059 A1 Aug. 30, 2012

Related U.S. Application Data

(63) Continuation-in-part of application No. 13/074,262, filed on Mar. 29, 2011, which is a continuation-in-part of application No. 13/036,489, filed on Feb. 28, 2011.

(51) Int. Cl.
*H03H 9/54* (2006.01)
*H03H 9/02* (2006.01)
(Continued)

(52) U.S. Cl.
CPC .............. *H03H 9/0211* (2013.01); *H03H 9/132* (2013.01); *H03H 9/585* (2013.01); *H03H 9/587* (2013.01);
(Continued)

(58) Field of Classification Search
CPC ... H03H 3/04; H03H 9/02086; H03H 9/0211; H03H 9/132; H03H 9/173; H03H 9/175; H03H 9/585; H03H 9/587; H03H 9/589; H03H 9/02007

USPC .......... 333/187–189; 310/322, 324, 326, 334, 310/335, 348, 349
See application file for complete search history.

(56) References Cited

U.S. PATENT DOCUMENTS

3,174,122 A 3/1965 Fowler et al.
3,189,851 A 6/1965 Fowler
(Continued)

FOREIGN PATENT DOCUMENTS

DE 10160617 6/2003
EP 231892 8/1987
(Continued)

OTHER PUBLICATIONS

Ohara et al.; "Suppression of Acoustic Energy Leakage in FBARs with Al Bottom Electrode: FEM Simulation and Experimental Results"; 2007 IEEE Ultrasonics Symposium, Oct. 28-31, 2007, pp. 1657-1660.*
(Continued)

*Primary Examiner* — Barbara Summons

(57) ABSTRACT

In a representative embodiment, a bulk acoustic wave (BAW) resonator comprises: a cavity provided in a first layer and having a perimeter bordering an active region of the BAW resonator, a distributed Bragg reflector (DBR) bordering the cavity, wherein the first layer is one of the layers of the DBR; a first electrode disposed over the substrate; a first piezoelectric layer disposed over the first electrode; a second electrode disposed over the first piezoelectric layer; a second piezoelectric layer disposed over the second electrode; a third electrode disposed over the second piezoelectric layer; and a bridge disposed between the first electrode and the third electrode.

41 Claims, 23 Drawing Sheets

(51) Int. Cl.
  *H03H 9/13* (2006.01)
  *H03H 9/58* (2006.01)
  *H03H 9/17* (2006.01)
  *H03H 3/04* (2006.01)

(52) U.S. Cl.
  CPC .............. *H03H 9/589* (2013.01); *H03H 3/04* (2013.01); *H03H 9/02007* (2013.01); *H03H 9/173* (2013.01); *H03H 9/175* (2013.01)

(56) References Cited

U.S. PATENT DOCUMENTS

| | | |
|---|---|---|
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,975,892 A | 12/1990 | Defranould et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,903,087 A | 5/1999 | Mattson et al. |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |

(56) References Cited

U.S. PATENT DOCUMENTS

| | | | |
|---|---|---|---|
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,148,466 B2 | 12/2006 | Eckman et al. |
| 7,158,659 B2 | 1/2007 | Baharav et al. |
| 7,161,448 B2 | 1/2007 | Feng et al. |
| 7,170,215 B2 | 1/2007 | Namba et al. |
| 7,173,504 B2 | 2/2007 | Larson, III et al. |
| 7,179,392 B2 | 2/2007 | Robert et al. |
| 7,187,254 B2 | 3/2007 | Su et al. |
| 7,199,683 B2 | 4/2007 | Thalhammer et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,235,915 B2 * | 6/2007 | Nakamura et al. ............ 310/335 |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson, III et al. |
| 7,345,410 B2 | 3/2008 | Grannen et al. |
| 7,358,831 B2 | 4/2008 | Larson, III et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,423,503 B2 | 9/2008 | Larson, III et al. |
| 7,425,787 B2 | 9/2008 | Larson, III |
| 7,439,824 B2 | 10/2008 | Aigner |
| 7,463,118 B2 | 12/2008 | Jacobsen |
| 7,466,213 B2 | 12/2008 | Lobl et al. |
| 7,468,608 B2 | 12/2008 | Feucht et al. |

(56) References Cited

U.S. PATENT DOCUMENTS

| | | | |
|---|---|---|---|
| 7,482,737 B2 | 1/2009 | Yamada et al. |
| 7,508,286 B2 | 3/2009 | Ruby et al. |
| 7,535,154 B2 | 5/2009 | Umeda et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,576,471 B1 | 8/2009 | Solal |
| 7,602,101 B2 | 10/2009 | Hara et al. |
| 7,616,079 B2 * | 11/2009 | Tikka et al. ............ 333/189 |
| 7,619,493 B2 | 11/2009 | Uno et al. |
| 7,629,865 B2 | 12/2009 | Ruby |
| 7,636,026 B2 | 12/2009 | Heinze et al. |
| 7,649,304 B2 | 1/2010 | Umeda et al. |
| 7,684,109 B2 | 3/2010 | Godshalk et al. |
| 7,768,364 B2 | 8/2010 | Hart et al. |
| 7,795,781 B2 | 9/2010 | Barber et al. |
| 7,869,187 B2 | 1/2011 | McKinzie et al. |
| 7,889,024 B2 | 2/2011 | Bradley et al. |
| 7,966,722 B2 | 6/2011 | Hart et al. |
| 7,978,025 B2 | 7/2011 | Yokoyama et al. |
| 8,008,993 B2 | 8/2011 | Milsom et al. |
| 8,030,823 B2 | 10/2011 | Sinha et al. |
| 8,222,795 B2 | 7/2012 | Sinha et al. |
| 8,253,513 B2 | 8/2012 | Zhang |
| 8,456,257 B1 | 6/2013 | Fattinger |
| 2001/0045793 A1 | 11/2001 | Misu et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0153965 A1 | 10/2002 | Ruby et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2003/0227357 A1 | 12/2003 | Metzger et al. |
| 2004/0016995 A1 | 1/2004 | Kuo et al. |
| 2004/0017130 A1 | 1/2004 | Wang et al. |
| 2004/0027216 A1 | 2/2004 | Ma et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093397 A1 | 5/2005 | Yamada et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0114541 A1 | 6/2006 | Van Beek |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0176126 A1 | 8/2006 | Wang et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284706 A1 | 12/2006 | Ginsburg et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2007/0291164 A1 | 12/2007 | Goh et al. |
| 2008/0055020 A1 | 3/2008 | Handtmann et al. |
| 2008/0129414 A1 | 6/2008 | Lobl et al. |
| 2008/0143215 A1 | 6/2008 | Hara et al. |
| 2008/0258842 A1 | 10/2008 | Ruby et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0001848 A1 | 1/2009 | Umeda et al. |
| 2009/0079302 A1 | 3/2009 | Wall et al. |
| 2009/0096550 A1 | 4/2009 | Handtmann et al. |
| 2009/0102319 A1 * | 4/2009 | Nakatsuka et al. ........... 310/326 |
| 2009/0127978 A1 | 5/2009 | Asai et al. |
| 2009/0153268 A1 | 6/2009 | Milson et al. |
| 2009/0201594 A1 | 8/2009 | Smith |
| 2009/0267457 A1 | 10/2009 | Barber et al. |
| 2010/0033063 A1 | 2/2010 | Nishihara et al. |
| 2010/0039000 A1 | 2/2010 | Milson et al. |
| 2010/0052815 A1 | 3/2010 | Bradley et al. |
| 2010/0091370 A1 | 4/2010 | Mahrt et al. |
| 2010/0107389 A1 | 5/2010 | Nessler et al. |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0187949 A1 | 7/2010 | Pahl et al. |
| 2010/0260453 A1 | 10/2010 | Block |

(56) References Cited

U.S. PATENT DOCUMENTS

| | | |
|---|---|---|
| 2010/0327697 A1 | 12/2010 | Choy et al. |
| 2010/0327994 A1 | 12/2010 | Choy et al. |
| 2011/0084779 A1 | 4/2011 | Zhang |
| 2011/0121916 A1 | 5/2011 | Barber et al. |
| 2011/0148547 A1 | 6/2011 | Zhang |
| 2011/0204996 A1 | 8/2011 | Gilbert et al. |
| 2012/0161902 A1 | 6/2012 | Feng et al. |
| 2012/0177816 A1 | 7/2012 | Larson et al. |
| 2012/0194297 A1 | 8/2012 | Choy |
| 2012/0218055 A1 | 8/2012 | Burak et al. |
| 2012/0218058 A1 | 8/2012 | Burak et al. |
| 2012/0218059 A1 | 8/2012 | Burak et al. |
| 2012/0218060 A1 | 8/2012 | Burak et al. |
| 2012/0280767 A1 | 11/2012 | Burak et al. |
| 2013/0038408 A1 | 2/2013 | Burak et al. |
| 2013/0082799 A1 | 4/2013 | Zuo et al. |
| 2013/0106534 A1 | 5/2013 | Burak et al. |
| 2013/0127300 A1 | 5/2013 | Umeda et al. |
| 2013/0205586 A1 | 8/2013 | Takada et al. |
| 2013/0235001 A1 | 9/2013 | Yun et al. |
| 2013/0241673 A1 | 9/2013 | Yokoyama et al. |
| 2014/0111288 A1 | 4/2014 | Nikkel et al. |
| 2014/0118088 A1 | 5/2014 | Burak et al. |
| 2014/0118091 A1 | 5/2014 | Burak et al. |
| 2014/0118092 A1 | 5/2014 | Burak et al. |

FOREIGN PATENT DOCUMENTS

| | | |
|---|---|---|
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299593 | 3/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 6165507 | 4/1986 |
| JP | 62-109419 | 5/1987 |
| JP | 62-200813 | 9/1987 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 2000-31552 | 1/2000 |
| JP | 2000-232334 | 8/2000 |
| JP | 2001-102901 | 4/2001 |
| JP | 2001-508630 | 6/2001 |
| JP | 2002/217676 | 8/2002 |
| JP | 2002217676 | 8/2002 |
| JP | 2003/017964 | 1/2003 |
| JP | 2003017964 | 1/2003 |
| JP | 2003/124779 | 4/2003 |
| JP | 2003124779 | 4/2003 |
| JP | 2006-109472 | 4/2006 |
| JP | 2006-295924 | 10/2006 |
| JP | 2007-006501 | 1/2007 |
| JP | 2007/028669 | 2/2007 |
| JP | 2007-208845 | * 8/2007 |
| JP | 2007-295306 | 11/2007 |
| JP | 2008-131194 | 6/2008 |
| JP | 2008-211394 | * 9/2008 |
| WO | WO-98/16957 | 4/1998 |
| WO | WO-98/56049 | 12/1998 |
| WO | WO-99/37023 | 7/1999 |
| WO | WO-01/06646 | 1/2001 |
| WO | WO-01/06647 | 1/2001 |
| WO | WO-0199276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |
| WO | 2006079353 | 8/2006 |
| WO | 2013065488 | 5/2013 |

OTHER PUBLICATIONS

IEEE Xplore Abstract for Suppression of Acoustic Energy Leakage in FBARs with Al Bottom Electrode: FEM Simulation and Experimental Results; Oct. 28-31, 2007, 2 pages.*

Machine Translation of JP 2008-211394, published Sep. 11, 2008, pp. 1-8.*

Machine Translation of JP 2007-208845, published Aug. 16, 2007, pp. 1-9.*

Co-pending U.S. Appl. No. 13/662,425, filed Oct. 27, 2012.
Co-pending U.S. Appl. No. 13/662,460, filed Oct. 27, 2012.
Co-pending U.S. Appl. No. 13/766,993, filed Feb. 14, 2013.
Co-pending U.S. Appl. No. 13/767,754, filed Feb. 14, 2013.
Co-pending U.S. Appl. No. 13/767,765, filed Feb. 14, 2013.
Co-pending U.S. Appl. No. 13/955,744, filed Jul. 31, 2013.
Co-pending U.S. Appl. No. 13/955,774, filed Jul. 31, 2013.
Co-pending U.S. Appl. No. 14/092,077, filed Nov. 27, 2013.
Aigner, Robert , "SAW, BAW and the Future of Wireless", May 6, 2013, pp. 1-4 May 6, 2013.
El Hassan, M. et al., "Techniques for Tuning BAW-SMR Resonators for the 4th Generation of Mobile Communications", *Intech* 2013 , 421-442.
Pineda, Humberto , "Thin-Film Bulk Acoustic Wave Resonators—FBAR", *Bellaterra, Monpelier* Dec. 2007 , 1-241.
Umeda, Keiichi et al., "Piezoelectric Properties of Scain Thin Films for Piezo-Mems Devices", *MEMS*, 2013, Taipei, Taiwan, Jan. 20-24, 2013 pp. 733-736 2013.
Co-pending U.S. Appl. No. 13/036,489, filed Feb. 28, 2011.
Co-pending U.S. Appl. No. 13/074,262, filed Mar. 29, 2011.
Co-pending U.S. Appl. No. 13/101,376, filed May 5, 2011.
Pensala, et al., "Spurious resonance supression in gigahertz-range ZnO thin-film bulk acoustic wave resonators by the boundary frame method: modeling and experiment", *IEEE Transactions on Ultrasonics, Ferroelectrics, and Frequency Control*, vol. 56, No. 8 Aug. 2009 , 1731-1744.
Pensala, , "Thin film bulk acoustic wave devices: performance optimization and modeling", http://www.vtt.fi/inf/pdf/publications/2011/P756.pdf, Dissertation presented Feb. 25, 2011, pp. 1-97.
Moriera, et al., "Aluminum Scandium Nitride Thin-Film Bulk Acoustic Resonators for Wide Band Applications", Vacuum 86 (2011) 23-26.
Tas, et al., "Reducing Anchor Loss in Micromechanical Extensional Mode Resonators", IEEE Transactions on Ultrasonics, Ferroelectrics and Frequency Control, vol. 57, No. 2, Feb. 2010, pp. 448-454.

(56) References Cited

OTHER PUBLICATIONS

Pandey, et al., "Anchor Loss Reduction in Resonant MEMS using MESA Structures", Proceedings of the 2nd IEEE International Conference on Nano/Micro Engineered and Molecular Systems, Jan. 16-19, 2007, Bangkok, Thailand, pp. 880-885.
Co-pending U.S. Appl. No. 13/074,094, filed Mar. 29, 2011.
Co-pending U.S. Appl. No. 12/710,640, filed Feb. 23, 2010.
U.S. Appl. No. 10/971,169, filed Oct. 22, 2004, Larson III, John D., et al.
Akiyama, et al., "Enhancement of Piezoelectric Response in Scandium Aluminum Nitride Alloy Thin Films Prepared by Dual Reactive Cosputtering", *Adv. Mater* 2009, 593-596.
Al-Ahmad, M. et al., "Piezoelectric-Based Tunable Microstrip Shunt Resonator", *Proceedings of Asia-Pacific Microwave Conference* 2006.
Aoyama, Takayuki et al., "Diffusion of Boron, Phosphorous, Arsenic and Antimony in Thermally Grown SiliconDioxide", *Journal of the Electrochemical Society*, vol. 146, No. 5 1999, 1879-1883.
Auld, B. A., "Acoustic Resonators", *Acoustic Fields and Waves in Solids, Second Edition*, vol. II 1990, 250-259.
Bauer, L. O. et al., "Properties of Silicon Implanted with Boron Ions through Thermal Silicon Dioxide", *Solid State Electronics*, vol. 16, No. 3 Mar. 1973, 289-300.
Bi, F.Z., "Bulk Acoustic Wave RF Technology", *IEEE Microwave Magazine*, vol. 9, Issue 5. 2008, 65-80.
Choi, Sungjin et al., "Design of Half-Bridge Piezo-Transformer Converters in the AC Adapter Applications", *APEC 2005, IEEE* Mar. 2005, 244-248.
Coombs, Clyde F., "Electronic Instrument Handbook", *Second Edition, McGraw-Hill, Inc.* 1995, pp. 5.1 to 5.29.
Denisse, C.M.M. et al., "Plasma-Enhanced Growth and Composition of Silicon Oxynitride Films", *J. Appl. Phys.*, vol. 60, No. 7. Oct. 1, 1986, 2536-2542.
Fattinger, G. G. et al., "Coupled Bulk Acoustic Wave Resonator Filters: Key technology for single-to-balanced RF filters", 0-7803-8331-1/4/W20.00; *IEEE MTT-S Digest* 2004, 927-929.
Fattinger, G.G. et al., "Single-To-Balance Filters for Mobile Phones Using Coupled Resonator BAW Technology", *2004 IEEE Ultrasonics Symposium* Aug. 2004, 416-419.
Fattinger, G. B. et al., "Spurious Mode Suppression in Coupled Resonator Filters", *IEEE MTT-S International Microwave Symposium Digest* 2005, 409-412.
Gilbert, S. R., "An Ultra-Miniature, Low Cost Single Ended to Differential Filter for ISM Band Applications", *Micro. Symp. Digest, 2008 IEEE MTT-S* Jun. 2008, 839-842.
Grill, A. et al., "Ultralow-K Dielectrics Prepared by Plasma-Enhanced Chemical Vapor Deposition", *App. Phys. Lett*, vol. 79 2001, 803-805.
Hadimioglu, B. et al., ""Polymer Films As Acoustic Matching Layers".", *1990 IEEE Ultrasonics Symposium Proceedings*, vol. 3 PP. [Previously submitted as "Polymer Files as Acoustic Matching Layers, 1990 IEEE Ultrasonics Symposium Proceeding. vol. 4 pp. 1227-1340, Dec. 1990". Considered by Examiner on Mar. 20, 2007 Dec. 1990, 1337-1340.
Hara, K., "Surface Treatment of Quartz Oscillator Plate by Ion Implantation", *Oyo Buturi*, vol. 47, No. 2 Feb. 1978, 145-146.
Holzlohner, Ronald et al., "Accurate Calculation of Eye Diagrams and Bit Error Rates in Optical Transmission Systems Using Linearization", *Journal of Lightwave Technology*, vol. 20, No. 3. Mar. 2002, pp. 389-400.
Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.
Jamneala, T. et al., "Coupled Resonator Filter with Single-Layer Acoustic Coupler", *IEEE Transaction on Ultrasonics, Ferroelectrics, and Frequency Control*, vol. 55 Oct. 2008, 2320-2326.

Jamneala, Tiberiu et al., "Ultra-Miniature Coupled Resonator Filter with Single-Layer Acoustic Coupler", *IEEE Transactions on Ultrasonics, Ferroelectrics and Frequency Control*, vol. 56, No. 11. Nov. 2009, 2553-2558.
Jiang, Yimin et al., "A Novel Single-Phase Power Factor Correction Scheme", *IEEE* 1993, 287-292.
Jung, Jun-Phil et al., "Experimental and Theoretical Investigation on the Relationship Between AIN Properties and AIN-Based FBAR Characteristics", *2003 IEEE International Frequency Control Symposium and PDA Exhibition Jointly with the 17th European Frequency and Time Forum* Sep. 3, 2003, 779-784.
Kaitila, J. et al., "Measurement of Acoustical Parameters of Thin Films", *2006 IEEE Ultrasonics Symposium* Oct. 2006, 464-467.
Krishnaswamy, S.V. et al., "Film Bulk Acoustic Wave Resonator Technology", May 29, 1990, 529-536.
Lakin, K.M., "Bulk Acoustic Wave Coupled Resonator Filters", *2002 IEEE International Frequency Control Symposium and PDA Exhibition* May 2002, 8-14.
Lakin, K.M., "Coupled Resonator Filters", *2002 IEEE Ultrasonics Symposium* Mar. 2, 2002, 901-908.
Lakin, K.M. et al., "High Performance Stacked Crystal Filters for GPS and Wide Bandwidth Applications", *2001 IEEE Ultrasonics Symposium* Jan. 1, 2001, 833-838.
Lakin, K. M. et al., "Temperature Compensated Bulk Acoustic Thin Film Resonators", *IEEE Ultrasonics Symposium, San Juan, Puerto Rico* Oct. 2000, 855-858.
Lakin, K.M., "Thin Film BAW Filters for Wide Bandwidth and High Performance Applications", *IEEE Microwave Symposium Digest*; vol. 2 Jun. 6-11, 2004, 923-926.
Lakin, K. M., "Thin Film Resonators and Filters", *IEEE Untrasonics Symposium, Caesar's Tahoe, NV* Oct. 1999, 895-906.
Lakin, et al., "Wide Bandwidth Thin Film BAW Filters", *2004 IEEE Ultrasonics Symposium*, vol. 1, Aug. 2004, 407-410.
Larson III, John D. et al., "Measurement of Effective Kt2,Q,Rp,Rs vs. Temperature for Mo/AIN FBAR Resonators", *IEEE Ultrasonics Symposium* 2002, 939-943.
Lee, Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004, 278-281.
Li, Yunxiu et al., "AC-DC Converter with Worldwide Range Input Voltage by Series and Parallel Piezoelectric Transformer Connection", *35th Annual IEEE Power Electronics Specialists Conference* 2004.
Lobl, H.P. et al., "Piezoelectric Materials for BAW Resonators and Filters", *2001 IEEE Ultrasonics Symposium* Jan. 1, 2001, 807-811.
Loboda, M. J., "New Solutions for Intermetal Dielectrics Using Trimethylsilane-Based PECVD Processes", *Microelectronics Eng.*, vol. 50. 2000, 15-23.
Martin, Steven J. et al., "Development of a Low Dielectric Constant Polymer for the Fabrication of Integrated Circuit Interconnect", *12 Advanced Materials* Dec. 23, 2000, 1769-1778.
Martinez, et al., "High confinement suspended micro-ring resonators in silicon-on-insulator", *Optics Express*, Vo. 14, No. 13 Jun. 26, 2006, 6259-6263.
Merriam-Webster,, "Collegiate Dictionary", *tenth edition* 2000, 2 pages.
Navas, J. et al., "Miniaturised Battery Charger using Piezoelectric Transformers", *IEEE* 2001, 492-496.
Ng, J. et al., "The Diffusion Ion-Implanted Boron in Silicon Dioxide", *AIP Conf. Proceedings*, No. 122 1984, 20-33.
Ohta, S. et al., "Temperature Characteristics of Solidly Mounted Piezoelectric Thin Film Resonators", *IEEE Ultrasonics Symposium, Honolulu, HI* Oct. 2003, 2011-2015.
Pang, W. et al., "High Q Single-Mode High-Tone Bulk Acoustic Resonator Integrated With Surface-Machined FBAR Filter", *Microwave Symposium Digest. IEEE MTT-S International* 2005, 413-416.
Parker, T. E. et al., "Temperature-Compensated Surface Acoustic-Wave Devices with SiO2 Film Overlays", *J. Appl. Physics*, vol. 50 1360-1369, Mar. 1979.
Reinhardt, Alexandre et al., "Design of Coupled Resonator Filters Using Admittance and Scattering Matrices", *2003 IEEE Ultrasonics Symposium* May 3, 2003, 1428-1431.

(56) References Cited

OTHER PUBLICATIONS

Ruby, R. C., "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Sanchez, A.M. et al., "Mixed Analytical and Numerical Design Method for Piezoelectric Transformers", *IEEE Xplore* 2003, 841-846.

Schoenholz, J.E. et al., "Plasma-Enhanced Deposition of Silicon Oxynitride Films", *Thin Solid Films* 1987, 285-291.

Schuessler, Hans H., "Ceramic Filters and Resonators", *Reprinted from IEEE Trans. Sonics Ultrason.*, vol. SU-21 Oct. 1974, 257-268.

Shirakawa, A. A. et al., "Bulk Acoustic Wave Coupled Resonator Filters Synthesis Methodology", *2005 European Microwave Conference*, vol. 1 Oct. 2005.

Small, M. K. et al., "A De-Coupled Stacked Bulk Acoustic Resonator (DSBAR) Filter with 2 dB Bandwidth >4%", *2007 IEEE Ultrasonics Symposium* Oct. 2007, 604-607.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Thomsen, C. et al., "Surface Generation and Detection of Phonons by Picosecond Light Pulses", *Phys. Rev. B*, vol. 34 1986, 4129.

Tiersten, H. F. et al., "An Analysis of Thickness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.

Topich, J. A. et al., "Effects of Ion Implanted Fluorine in Silicon Dioxide", *Nuclear Instr. and Methods, Cecon Rec, Cleveland OH* May 1978, 70-73.

Tsubbouchi, K. et al., "Zero Temperature coefficient Surface Acoustic Wave Devices using Epitaxial AIN Films", *IEEE Ultrasonic symposium, San Diego, CA*, 1082 1982, 240-245.

Vasic, D et al., "A New Method to Design Piezoelectric Transformer Used in MOSFET & IGBT Drive Circuits", *IEEE 34th Annual Power Electronics Specialists Conference*, 2003 vol. 1 Jun. 15-19, 2003, 307-312.

Vasic, D et al., "A New MOSFET & IGBT Gate Drive Insulated by a Piezoelectric Transformer", *IEEE 32 nd Annual Power Electronics Specialists Conference*, 2001 vol. 3 2001, 1479-1484.

Yanagitani, et al., "Giant Shear Mode Electromechanical Coupling Coefficient k15 in C-Axis Tilted Slain Films", *IEEE International Ultrasonics Symposium* 2010.

Yang, C.M. et al., "Highly C Axis Oriented AIN Film Using MOCVD for 5GHx Band FBAR Filter", *2003 IEEE Ultrasonics Symposium* Oct. 5, 2003, pp. 170-173.

Co-pending U.S. Appl. No. 13/161,946, filed Jun. 16, 2011.
Co-pending U.S. Appl. No. 13/286,038, filed Oct. 31, 2011.
Co-pending U.S. Appl. No. 13/654,718, filed Oct. 18, 2012.
Co-pending U.S. Appl. No. 13/658,024, filed Oct. 23, 2012.
Co-pending U.S. Appl. No. 13/660,941, filed Oct. 25, 2012.
Co-pending U.S. Appl. No. 13/663,449, filed Oct. 29, 2012.
Co-pending U.S. Appl. No. 13/781,491, filed Feb. 28, 2013.

Lee, et al., "Development of High-Auality FBAR Devices for Wireless Applications Employing Two-Step Annealing Treatments", *IEEE Microwave and Wireless Components Letters*, vol. 21, No. 11 Nov. 2011.

Tang, et al., "Micromachined Bulk Acoustic Resonator With a Raised Frame", *16th International Conference on Mechatronics Technology*, Oct. 16-19, 2012, Tianjin, China.

\* cited by examiner

STACKED BULK ACOUSTIC RESONATOR COMPRISING A BRIDGE AND AN ACOUSTIC REFLECTOR ALONG A PERIMETER OF THE RESONATOR

CROSS-REFERENCE TO RELATED APPLICATIONS

This application is a continuation-in-part application of commonly owned U.S. patent application Ser. No. 13/074,262 entitled "Stacked Acoustic Resonator Comprising Bridge" filed on Mar. 29, 2011 to Dariusz Burak, et al. The present application claims priority under 35 U.S.C. §120 to U.S. patent application Ser. No. 13/074,262, the disclosure of which is hereby incorporated by reference in its entirety.

BACKGROUND

Transducers generally convert electrical signals to mechanical signals or vibrations, and/or mechanical signals or vibrations to electrical signals. Acoustic transducers, in particular, convert electrical signals to acoustic signals (sound waves) in a transmit mode and/or convert received acoustic waves to electrical signals in a receive mode. Acoustic transducers generally include acoustic resonators, such as thin film bulk acoustic resonators (FBARs), surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. For example, FBARs may be used for electrical filters and voltage transformers. Generally, an acoustic resonator has a layer of piezoelectric material between two conductive plates (electrodes), which may be formed on a thin membrane. FBAR devices, in particular, generate laterally propagating acoustic waves when stimulated by an applied time-varying electric field confined to finite-sized electrodes, as well as higher order harmonic mixing products. The lateral modes and the higher order harmonic mixing products may have a deleterious impact on functionality.

A stacked bulk acoustic resonator (SBAR), also referred to as a double bulk acoustic resonator (DBAR), includes two layers of piezoelectric materials between three electrodes in a single stack, forming a single resonant cavity. That is, a first layer of piezoelectric material is formed between a first (bottom) electrode and a second (middle) electrode, and a second layer of piezoelectric material is formed between the second (middle) electrode and a third (top) electrode. Generally, the stacked bulk acoustic resonator device allows reduction of the area of a single bulk acoustic resonator device by about half.

In FBAR devices, mitigation of acoustic losses at the boundaries and the resultant mode confinement in the active region of the FBAR (the region of overlap of the top electrode, the piezoelectric layer, and the bottom electrode) has been effected through various methods. Notably, frames are provided along one or more sides of the FBARs. The frames create an acoustic impedance mismatch that reduces losses by reflecting desired modes back to the active area of the resonator, thus improving the confinement of desired modes within the active region of the FBAR and minimizing conversion of these modes at the edges of the electrodes into unwanted modes that cannot couple back to electric field (like shear and flexural modes).

While the incorporation of frames has resulted in improved mode confinement and attendant improvement in the quality (Q) factor of the FBAR, direct application of known frame elements has not resulted in significant improvement in mode confinement and Q of known DBARs.

What is needed, therefore, is a DBAR that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
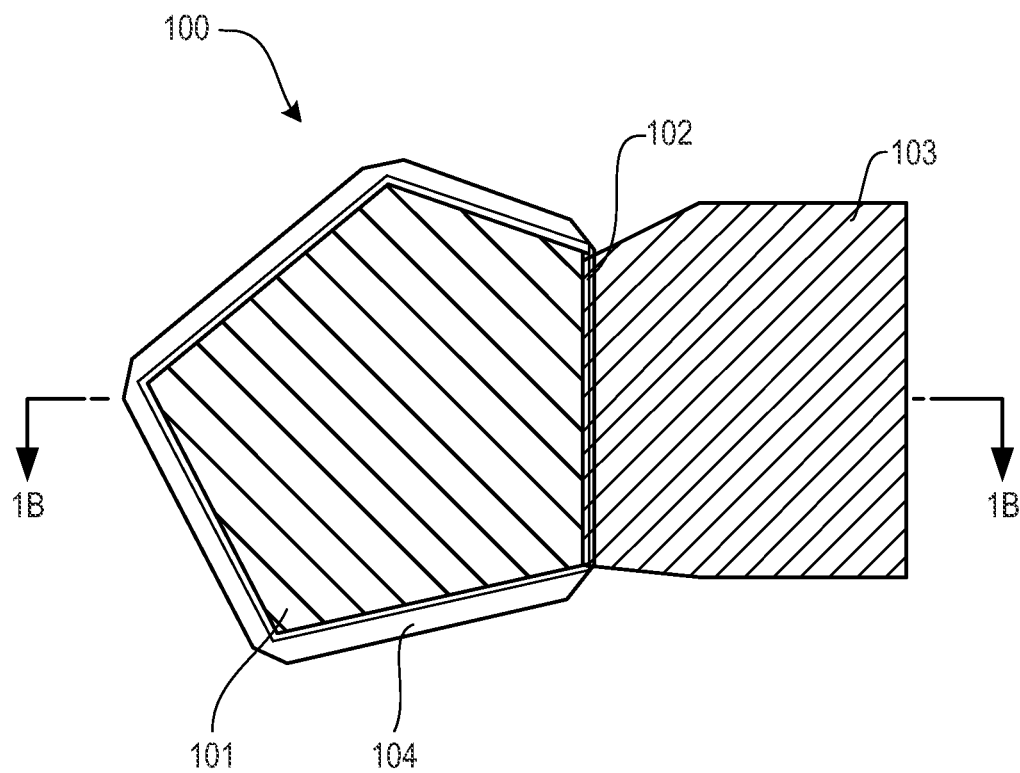
FIG. 1A is a top view of a DBAR in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonators, and particularly to DBARs. In certain applications, the BAW resonators provide DBAR-based filters (e.g., ladder filters). Certain details of BAW resonators and filters comprising BAW resonators, materials used therein and methods of fabrication thereof may be found in one or more of the following commonly owned U.S. Patents and Patent Applications: U.S. Pat. No. 6,107,721, to Lakin; U.S. Pat. Nos. 5,587,620, 5,873,153, 6,060,818, 6,507,983, and 7,629,865 to Ruby, et al.; U.S. Pat. No. 7,280,007, to Feng, et al.; U.S. Patent Publication No. 20070205850 to Jamneala, et al.; U.S. Pat. No. 7,388,454, to Ruby, et al.; U.S. Patent Publication No. 20100327697 to Choy, et al.; and U.S. Patent Publication No. 20100327994 to Choy, et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

FIG. 1A shows a top view of a DBAR 100 in accordance with a representative embodiment. The DBAR 100 comprises a top electrode 101 (referred to below as third electrode 101), comprising five (5) sides, with a connection side 102 configured to provide the electrical connection to an interconnect 103. The interconnect 103 provides electrical signals to the top electrode 101 to excite desired acoustic waves in piezoelectric layers (not shown in FIG. 1) of the DBAR 100. The top electrode 101 comprises a bridge 104 (referred to below as second bridge 104) disposed on all sides (the bridge on the connection side 102 cannot be seen in the top view of FIG. 1A). As described more fully in the parent application, providing the bridge 104 about the perimeter of the DBAR 100 contributes to improved insertion loss and the Q-factor of the odd mode ($Q_o$) over a desired frequency range (e.g., a passband of the DBAR).

Figure 1B:
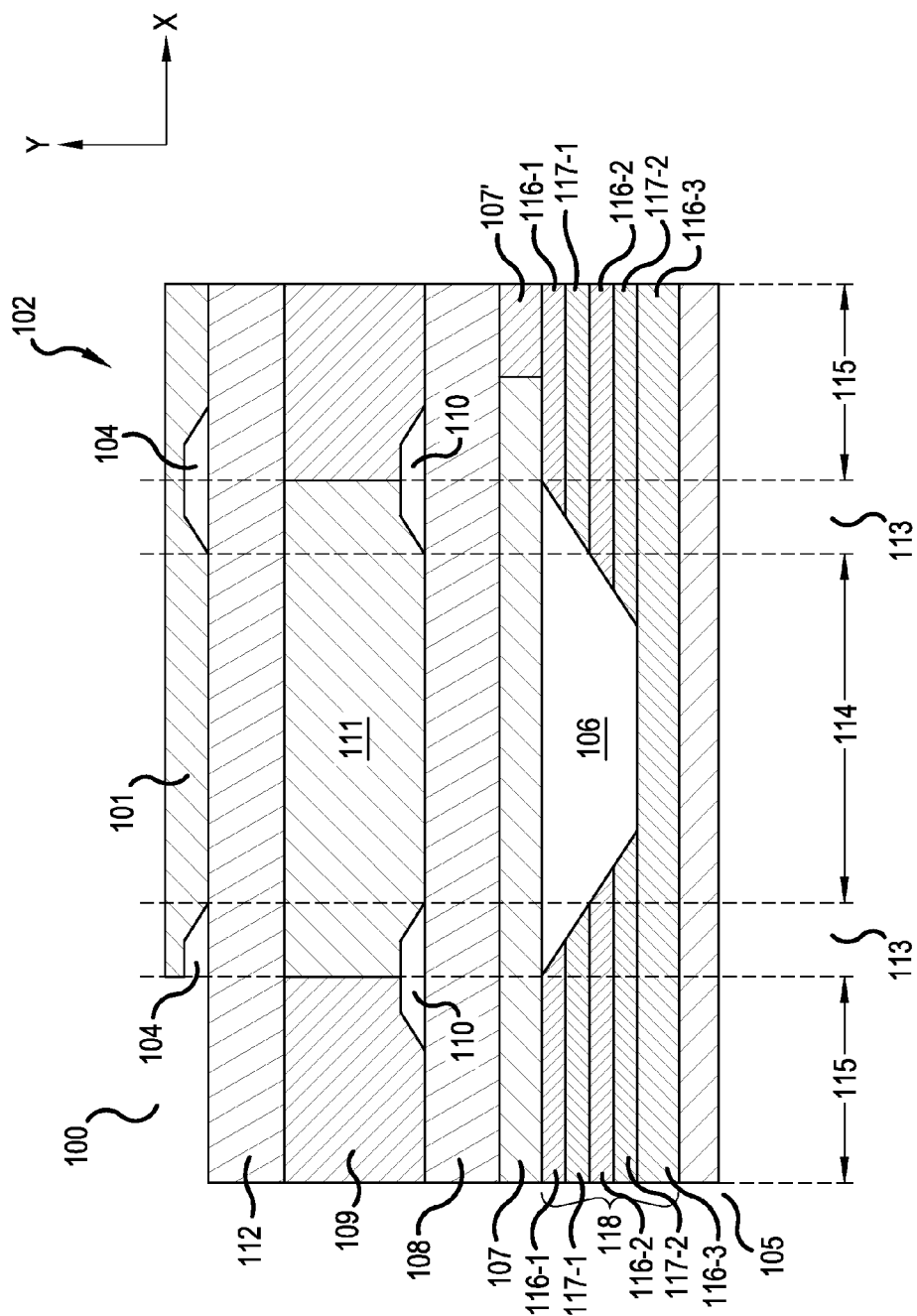
FIGS. 1B~1E are cross-sectional views of DBARs in accordance with a representative embodiment.

FIG. 1B shows a cross-sectional view of the DBAR 100 taken along line 1B-1B in accordance with a representative embodiment. The DBAR 100 comprises a plurality of layers disposed over a substrate 105 having a cavity 106.

A first electrode 107 is disposed over the substrate 105 and partially over the cavity 106. A planarization layer 107' is provided over the substrate as shown. In a representative embodiment, the planarization layer 107' comprises non-etchable borosilicate glass (NEBSG). A first piezoelectric layer 108 is disposed over the first electrode 107. A second electrode 111 is disposed over the first piezoelectric layer 108. A planarization layer 109 is also disposed over the first piezoelectric layer 108 and generally does not overlap the cavity 106. In a representative embodiment, the planarization layer 109 comprises non-etchable borosilicate glass (NEBSG). In an embodiment, the first bridge 110 is disposed along all sides (i.e., along the perimeter) of the DBAR 100. As should be appreciated by one of ordinary skill in the art, the structure provided by the first electrode 107, the first piezoelectric layer 108 and a second electrode 111 is a bulk acoustic wave (BAW) resonator, which in this illustrative embodiment comprises a first BAW resonator of the DBAR 100. A second piezoelectric layer 112 is disposed over the second electrode 111 and over the planarization layer 109. A third electrode 101 is disposed over the second piezoelectric layer 112. In an embodiment, the second bridge 104 is disposed along all sides (i.e., along the perimeter) of the DBAR 100. The structure provided by the second electrode 111, the second piezoelectric layer 112 and the third electrode 101 is also a BAW resonator, which in this illustrative embodiment comprises a second BAW resonator of the DBAR 100.

A first bridge 110 is provided at an interface of a second electrode 111 and the planarization layer 109, and is disposed along all sides of the DBAR 100 (i.e., forms a perimeter of the DBAR 100). In representative embodiments first and second bridges 110, 104 (and other bridges described in connection with representative embodiments below) have a trapezoidal cross-sectional shape. It is emphasized that the trapezoidal cross-sectional shape of the bridges of the representative embodiments is merely illustrative and the bridges are not limited to a trapezoidal cross-sectional shape. For example, the cross-sectional shape of the bridges of the representative embodiments could be square or rectangular, or of an irregular shape. The "slanting" walls of first and second bridges 110, 104 (and other bridges described in connection with representative embodiments below) is beneficial to the quality of layers (e.g., the quality of the crystalline piezoelectric layer(s)) grown over the first and second bridges 110, 104 (and other bridges described in connection with representative embodiments below). Notably, the first bridge 110 and the second bridge 104 (and other bridges described in connection with representative embodiments below) are not necessarily the same shape (e.g., one could have trapezoidal cross-sectional shape and one could have a rectangular cross-sectional in shape). Typical dimensions of the first and second bridges 110, 104 (and other bridges described in connection with representative embodiments below) are approximately 2.0 µm to approximately 10.0 µm in width (x-dimension in the coordinate system shown in FIG. 1B) and approximately 150 Å to approximately 3000 Å in height (y-dimension in the coordinate system shown in FIG. 1B). In certain embodiments, first and second bridges 110, 104 (and other bridges described in connection with representative embodiments below) extend over the cavity 106 (depicted as overlap 113 in FIG. 1B). The overlap 113 (also referred to as the decoupling region) has a width (x-dimension) of approximately 0.0 µm (i.e., no overlap with the cavity 106) to approximately 10.0

μm. Notably, the first bridge 110 and the second bridge 104 (and other bridges described in connection with representative embodiments below) do not need to be the same dimensions or located at the same relative position. For example, the overlap 113 of the first and second bridges 110, 104 with cavity 106 is shown in FIG. 1B to be identical for all bridges 104, 110; but this is not essential as different bridges 104, 110 may overlap the cavity 106 to a greater or lesser extent than other bridges 104, 110.

Generally, the first and second bridges 110, 104 (and other bridges described in connection with representative embodiments below) extend over the cavity 106 (depicted as overlap 113 in FIG. 1B). The overlap 113 (also referred to as the decoupling region) has a width (x-dimension) of approximately 0.0 μm (i.e., no overlap with the cavity 106) to approximately 10.0 μm. Generally, the optimum width of the first and second bridges 110, 104 (and other bridges described in connection with representative embodiments below) depends on the reflection of the eigenmodes at the boundary of an active region 114 (also referred to herein as a DBAR region) and a decoupling region 113 (i.e., the overlap 113). Due to the lesser thickness of layers in the decoupling region 113, only complex evanescent modes for the thickness-extensional motion can exist at the operating frequency of the DBAR 100. These complex evanescent modes are characterized by a characteristic decay length and by a specific propagation constant. The first and second bridges 110, 104 need to be wide enough to ensure suitable decay of complex evanescent waves excited at the boundary of active region 114 and the decoupling region 113. Wide bridges minimize tunneling of energy into a field region 115 where propagating modes exist at the frequency of operation.

On the other hand, if the first and second bridges 110, 104 are too wide, reliability issues can arise and can also limit the placement of similar DBARs (not shown) from being placed in proximity (thus unnecessarily increasing the total area of a chip). In practical situations, the propagating component of the complex evanescent waves can be used to find the optimum width of the first and second bridges 110, 104. In general, when the width of the first and second bridges 110 and 104 is equal to an odd multiple of the quarter-wavelength of the complex evanescent wave, the reflectivity of the eigenmodes can be further increased, which can be manifested by parallel resistance Rp and Q-factor attaining maximum values. Typically, depending on the details of the excitation mechanism, other propagating modes of the decoupling region 113, such as shear modes and flexural modes, can impact Rp and Q-factor. The width of the first and the second bridges 110, 104 can be modified in view of these other propagating modes. Such optimum width of the first and second bridges 110, 104 may be determined experimentally.

In addition, the width and position of the first and second bridges 110, 104 (and other bridges described in connection with representative embodiments) and overlap 113 with the cavity 106 are selected to improve Q-enhancement of the odd resonant mode. In general, the greater the overlap 113 of each bridge 110, 104 with the cavity 106 of the DBAR 100, the greater the improvement $Q_o$ with the improvement realized being fairly small after an initial increase. The improvement in $Q_o$ must be weighed against a decrease in the electromechanical effective coupling coefficient $kt^2$, which decreases with increasing overlap 113 of the first and second bridges 110, 104 with the cavity 106. Degradation of $kt^2$ results in a degradation of insertion loss ($S_{21}$) of a filter comprising DBARs. As such, the overlap 113 of the first and second bridges 110, 104 with the cavity 106 is typically optimized experimentally.

The first and second bridges 110, 104 (and other bridges described in connection with representative embodiments below) have a height (y-dimension in the coordinate system of FIG. 1B) of approximately 150 Å to approximately 3000 Å. Notably, the lower limit of the height is determined by the limits of the process of releasing sacrificial material in the forming of the first and second bridges 110, 104 (and other bridges described in connection with representative embodiments below), and the upper limit of the height is determined by the quality of layers grown over the first and second bridges 110, 104 (and other bridges described in connection with representative embodiments) and by the quality of subsequent processing of possibly non-planar structures.

Illustratively, the first electrode 107, second electrode 111 and the third electrode 101 are tungsten (W) having a thickness of approximately 1000 Å to approximately 20000 Å. Other materials may be used for the first electrode 107, second electrode 111 and the third electrode 101, including but not limited to molybdenum (Mo), iridium (Ir), copper (Cu), aluminum (Al) or a bi-metal material. Illustratively, the first piezoelectric layer 108 and the second piezoelectric layer 112 are aluminum nitride (AlN) having a thickness of approximately 5000 Å to approximately 25000 Å. Other materials may be used for the first piezoelectric layer 108 and the second piezoelectric layer 112, including but not limited to ZnO.

The first and second bridges 110, 104 are formed by patterning a sacrificial material over the first piezoelectric layer 108 and the second piezoelectric layer 112, and forming the depicted layers thereover. After the layers of the DBAR 100 are formed as desired, the sacrificial material is released leaving the first and second bridges 110, 104 "filled" with air. In a representative embodiment, the sacrificial material used to form the first and second bridges 110, 104 is the same as the sacrificial material used to form the cavity 106 (e.g., PSG).

In a representative embodiment, the first bridge 110 and the second bridge 104 define a perimeter along the active region 114 of the DBAR 100. The active region 114 thus includes the portions of the first BAW resonator and the second BAW resonator disposed over the cavity 106 and bounded by the perimeter provided by the first bridge 110 and the second bridge 104. As should be appreciated by one of ordinary skill in the art, the active region of the DBAR 100 is bordered around its perimeter by an acoustic impedance discontinuity created at least in part by the first and second bridges 110, 104, and above and below (cavity 106) by an acoustic impedance discontinuity due to the presence of air. Thus, a resonant cavity is beneficially provided in the active region of the DBAR 100. In certain embodiments, the first bridge 110 and the second bridge 104 are unfilled (i.e., contain air), as is the cavity 106. In other embodiments described more fully below, the first bridge 110, or the second bridge 104, or both, are filled with a material to provide the desired acoustic impedance discontinuity.

It is noted that the first bridge 110, or the second bridge 104, or both, do not necessarily have to extend along all edges of the DBAR 100, and therefore not along the perimeter of the DBAR 100. For example, the first bridge 110 or the second bridge 104, or both, may be provided on four "sides" of the five-sided DBAR 100 shown in FIG. 1A. In certain embodiments, the first bridge 110 is disposed along the same four sides of the DBAR 100 as the second bridge 104. In other embodiments, the first bridge 110 is disposed along four sides (e.g., all sides but the connection side 102) of the DBAR 100 and the second bridge 104 is disposed along four sides of the DBAR 100, but not the same four sides as the first bridge 110 (e.g., second bridge 104 is disposed along the connection side 102).

The acoustic impedance mismatch provided by the first bridge 110 and the second bridge 104 causes reflection of acoustic waves at the boundary that may otherwise propagate out of the active region and be lost, resulting in energy loss. The first bridge 110 and the second bridge 104 serve to confine the modes of interest within the active region 114 of the DBAR 100 and reduce energy losses in the DBAR 100. Reducing such losses serves to increase the Q-factor ($Q_o$) of the modes of interest in the DBAR 100. In filter applications of the DBAR 100, as a result of the reduced energy loss, the insertion loss ($S_{21}$) is beneficially improved.

Generally, if the frequency of the driving electric field is close to the series resonance frequency for the full wavelength thickness extensional mode (known as the TE2 mode), the TE2 mode is predominantly excited. As mentioned above, the first and second bridges 110, 104 foster decoupling of the TE2 mode from the laterally propagating modes in the outside field region 115. However, the edge of the cavity 106 presents a large acoustic impedance discontinuity to the modes that are supported in the decoupling region 113. That impedance discontinuity couples both evanescent modes (i.e., complex TE2 mode) and propagating modes (e.g., TE1 mode, shear modes and flexural modes) in the decoupling region 113 to the freely propagating modes of the substrate, leading to radiative energy losses and reduction of the Q-factor. Notably, this loss is not addressed by the first and second bridges 110, 104 which mostly decouple waves propagating in the lateral direction (x-z plane in the coordinate system depicted in FIG. 1B) from the analogous waves propagating along the layers boundaries in the outside field region 115.

Mitigation of acoustic losses in the vertical direction (y-dimension in the coordinate system depicted in FIG. 1B) of the DBAR 100 is realized by the present teachings through a distributed Bragg reflector (DBR) 118 provided around the perimeter of the cavity 106. In particular, the DBR 118 comprises first Bragg layers 116-1, 116-2, 116-3, and second Bragg layers 117-1, 117-2, but structures with more layers are also possible. The principle of operation of the DBR 118 relies on the fact that due to destructive interference of an incident acoustic wave its total amplitude decays exponentially in the direction of propagation through the stack (in this case away from the interface between first electrode 107 and first Bragg layer 116-1). In general, such beneficial exponential decay of wave amplitude is only possible if the thicknesses of the layers comprising DBR are equal or close to equal to an odd multiple of the wavelength of an incident acoustic wave. At the bottom of the DBR stack (in this case at the interface between first Bragg layer 116-3 and substrate 105) the wave amplitude is small, thus yielding negligible radiation of acoustic energy into the substrate 105. In other words, the acoustic energy incident upon the DBR 118 is being reflected back with only small transmission of acoustic energy into the substrate 105. Notably, the beneficial reflectivity properties of DBR 118 are in general possible only for a limited range of frequencies, a specific polarization and a limited range of propagation angles of an incident wave. In practical cases when the range of frequencies is given by a bandwidth of the filter and multiple eigenmodes are being excited in the DBAR region the optimal thicknesses of DBR layers are found numerically and experimentally.

The first Bragg layers 116-1, 116-2, 116-3 are comparatively low acoustic impedance layers and are provided beneath the first electrode 107 and the planarization layer 107'; and the second Bragg layers 117-1, 117-2 having comparatively high acoustic impedance are disposed beneath first Bragg layers 116-1 and 116-2, respectively. It is noted that the use of five Bragg layers (e.g., first and second Bragg layers 116-1, 116-2, 116-3, 117-1, 117-2) is merely illustrative, and the DBR 118 may comprise more than five Bragg layers. The number of Bragg layers provided for the DBR is determined by a tradeoff between expected reflection performance (the more layers the better) and cost and processing issues (the fewer layers the cheaper and more straightforward mirror growth and post-processing).

The amount of acoustic isolation of the excited eigenmodes provided by DBR 118 also depends on the contrast between the acoustic impedances of the adjacent Bragg layers, with a greater amount of contrast creating better acoustic reflection of the vertical component of the eigenmodes. In some embodiments, the first and second Bragg layers 116-1~117-2 are formed of a pair of dielectric materials having contrasting acoustic impedances. One example of such a pair of dielectric materials comprises alternating layers of sputter-deposited silicon carbide (SiC) and plasma enhanced chemical vapor deposited (PECVD) SiC. Notably, the sputter-deposited SiC layer has a comparatively high acoustic impedance and the PECVD SiC layer has a comparatively low acoustic impedance. As such, according to one embodiment, the first Bragg layers 116-1, 116-2, 116-3 each comprise PECVD SiC and the second Bragg layers 117-1, 117-2 each comprise sputter-deposited SiC. Another example of such a pair of dielectric layers is carbon-doped silicon oxide (CDO) and silicon nitride. As such, according to another representative embodiment, the second Bragg layers 117-1, 117-2 each comprise silicon nitride and the first Bragg layers 116-1, 116-2, 116-3 each comprise CDO.

The DBR 118 is formed before the formation of the cavity 106 and the subsequent layers of the DBAR 100. In particular, the layers of the DBR 118 are provided over the substrate 105 using selected materials deposited by known methods. For example, the first Bragg layer 116-3 may be formed over the substrate 105, and the second Bragg layer 117-2 is formed over the first Bragg layer 116-3. In all embodiments, however, the first Bragg layer 116-1, which has a comparatively low acoustic impedance, is provided beneath the first electrode 107. The layers of the DBR 118 can be fabricated using various known methods, an example of which is described in U.S. Pat. No. 7,358,831 to Larson, III, et al., the disclosure of which is hereby incorporated by reference.

In general, DBAR 118 is defined by the presence of air (essentially zero impedance material) at both top and bottom boundaries. Therefore vertical stress components are zero at these boundaries. Through the proper selection of materials, the first Bragg layers 116-1, 116-2, 116-3 can have a very low acoustic impedance compared to the first electrode 107, which may also lead to a lowered vertical stress at the boundary between the first electrode 107 and the first Bragg layer 116-1. Such a lowered stress condition (defining the overall thickness (y-dimension in the depicted coordinate system) of the DBAR) is however only possible when thickness of the first Bragg layer 116-1 is reasonably close to an odd multiple of the quarter wavelength of the fundamental eigenmode (e.g., TE2) for which the DBR 118 is being designed. Adding more layers to the DBR 118 further lowers the vertical stress at the interface between the first electrode 107 and the first Bragg layer 116-1, thus allowing for closer approximation of an ideal zero-stress condition. However, as mentioned above, while lower vertical stress for the TE2 mode is realized by the selection of the thickness of the first Bragg layer 116-1, for other modes which are excited either electrically or mechanically (by modal coupling at the lateral edges of the membrane) that must not necessarily be the case and leakage of these modes through the DBR 118 may be actually enhanced (leading to lesser than expected energy confinement).

The first and second Bragg layers 116-1, 117-1, 116-2, 117-2 combined have a thickness (y-dimension of the coordinate system of FIG. 1B) substantially equal to the depth (y-dimension) of the cavity 106 as depicted in FIG. 1B. In general, the depth of the cavity 106 is determined by the etch properties of the sacrificial material and by possible downward bowing of the released membrane (i.e., layers of the DBAR 100 disposed over the cavity 106) in the case of residual compressive stress in the layers of the membrane being present. Usually deeper cavities are more beneficial from the membrane release process point of view, but they also yield somewhat more difficult initial etch process. If the above mentioned features of the release process require deeper cavities than the thickness of the first and second Bragg layers 116-1, 117-1, 116-2, 117-2, one can increase the depth of the cavity 106 by continued etching the first Bragg layer 116-3.

The first and second Bragg layers 116-1, 117-1, 116-2, 17-2 have thicknesses in the range of approximately 3000 Å to approximately 50000 Å, depending on the material used and the frequency operating range of the filter. As mentioned above, thickness of all layers comprising the DBR 118 is substantially equal to one quarter-wavelength of the fundamental eigenmode in the selected material and excited at the selected operational frequency (e.g., series resonance frequency). For example, if each of the first Bragg layers 116-1, 116-2, 116-3 comprises CDO for operation at 800 MHz (series resonance frequency) the each of the first Bragg layers 116-1, 116-2, 116-3 116 has a thickness of approximately 1.2 μm. In this example, second Bragg layer may comprise SiN, having a thickness of approximately 3.2 μm for operation at 800 MHz. Notably, the thickness of all layers of the DBR 118 can be selected to be odd-multiple (e.g., 3) quarter-wavelengths of the fundamental DBAR eigenmode in the selected material (e.g., if one quarter-wavelength layer is too thin for practical processing).

After the first and second Bragg layers 116-1, 117-1, 116-2 deposited, the cavity 106 is etched according to a known method and filled with a sacrificial layer, such as described in U.S. Pat. No. 6,060,818. The remaining layers of the DBAR 100 are then provided over the filled cavity and the first and second Bragg layers 116-1, 117-1, 116-2 using a known method such as described above, in the parent application and/or one or more of the incorporated patents and patent publications referenced above.

Figure 1C:
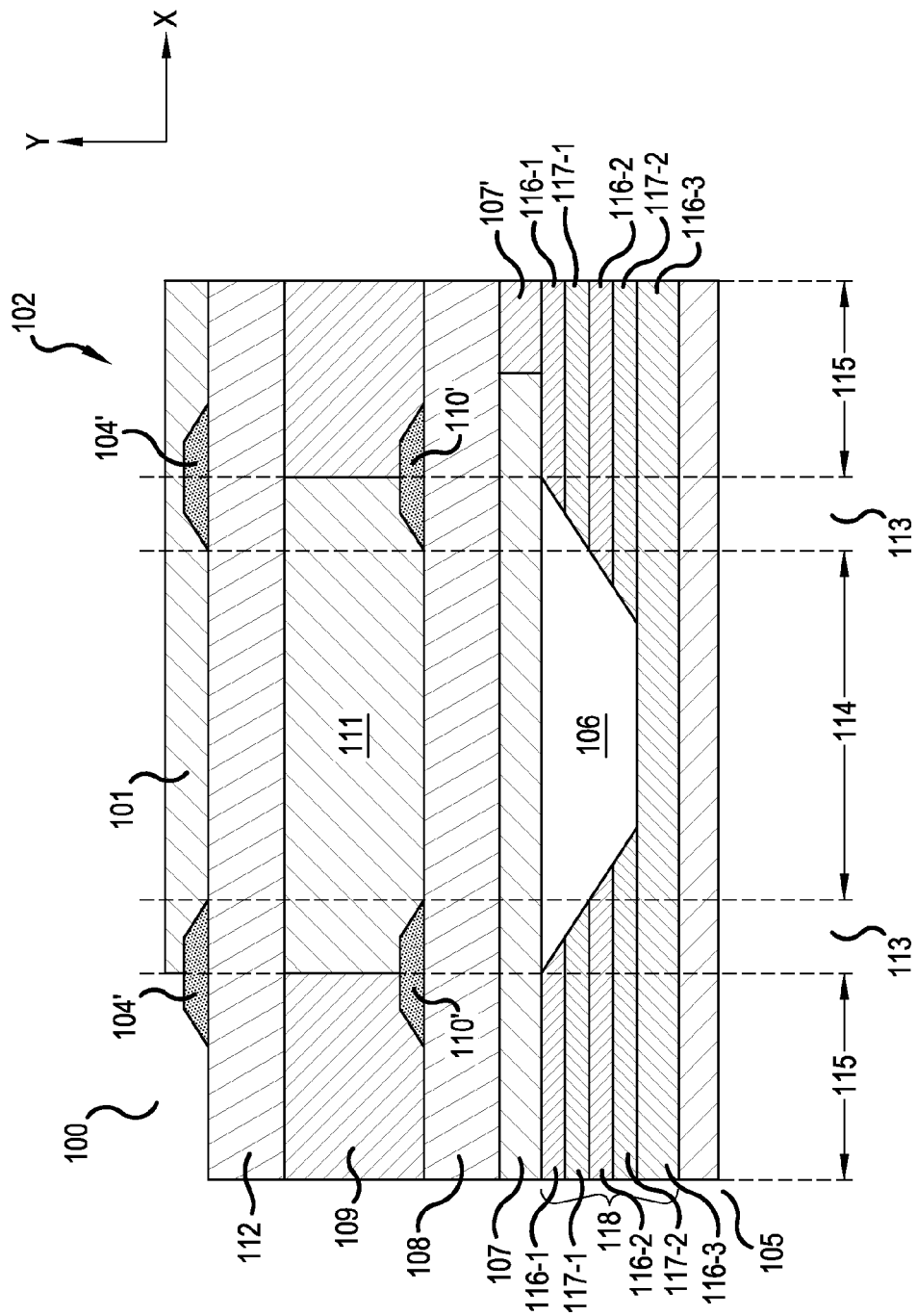

In the representative embodiment shown and described in connection with FIGS. 1A, 1B, the first and second bridges 110, 104 were unfilled (i.e., contained air as the acoustic medium). FIG. 1C shows a cross-sectional view of DBAR 100 including the DBR 118 in accordance with another representative embodiment. In the DBAR 100 depicted in FIG. 1C in both bridges are filled with a material to provide the acoustic impedance discontinuity to reduce losses. In certain embodiments, first bridge 110' and second bridge 104' are filled with NEBSG, CDO, silicon carbide (SiC) or other suitable dielectric material that will not release when the sacrificial material disposed in the cavity 106 is released. In other embodiments, first bridge 110' and second bridge 104' are filled with one of tungsten (W), molybdenum (Mo), copper (Cu), iridium (Ir) or other suitable metal materials (e.g., alloys) that will not release when the sacrificial material disposed in the cavity 106 is released. The first and second bridges 110', 104' are fabricated by forming the NEBSG or other fill material over the first piezoelectric layer 108 and over the second piezoelectric layer 112 by a known method, and forming respective layers of the DBAR 100 thereover. When the cavity 106 is formed through the release of the sacrificial, the first bridge 110' and the second bridge 104' remain "filled" with the selected material.

Figure 1D:
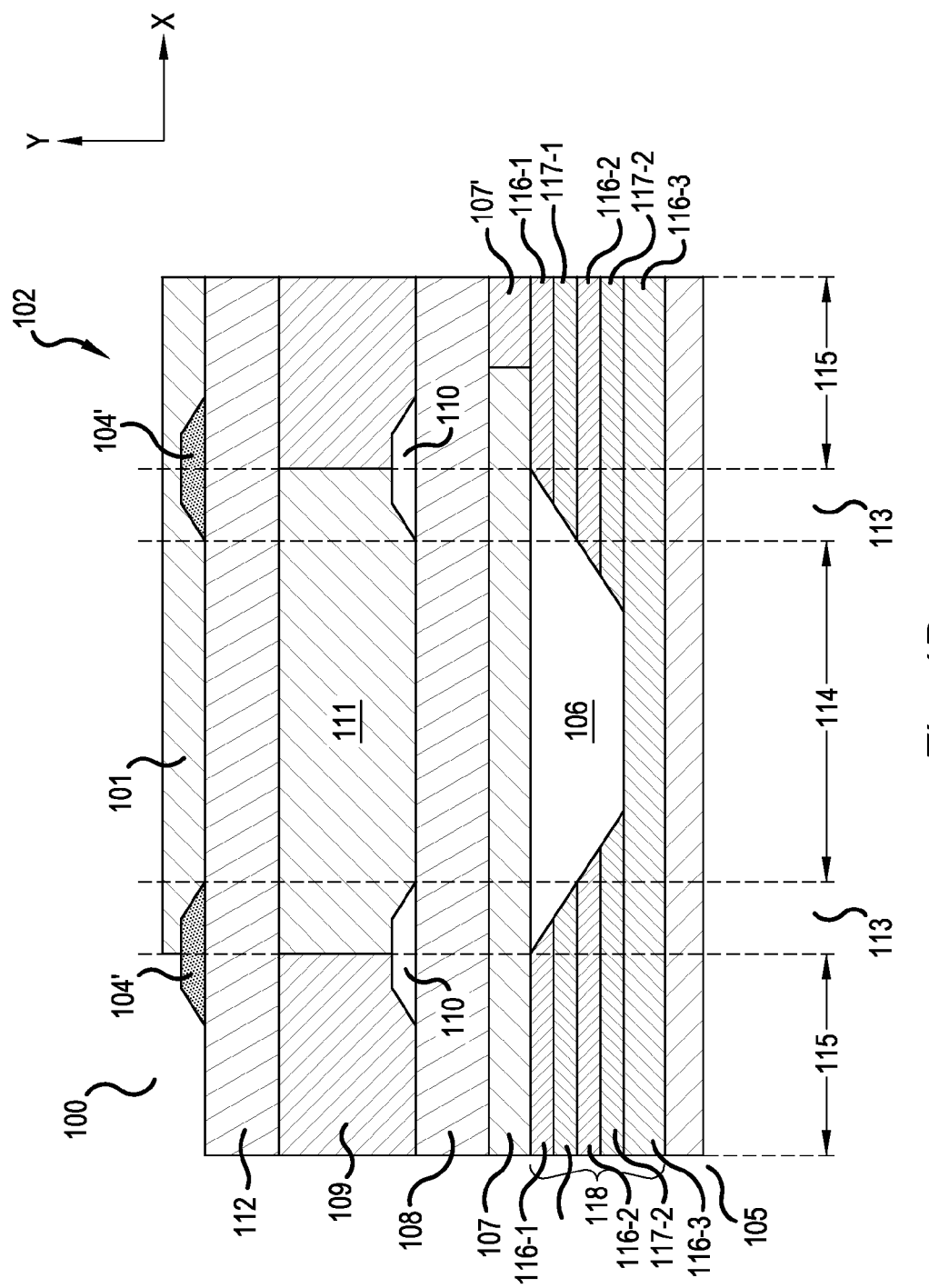

FIG. 1D shows a cross-sectional view of DBAR 100 including the DBR 118 in accordance with another representative embodiment. In the DBAR 100 depicted in FIG. 1D the second bridge 104' is filled with a material to provide the acoustic impedance discontinuity to reduce losses, and the first bridge 110 is filled with air. This modification of the DBAR 100 is fabricated by patterning a material (e.g., NEBSG) over the second piezoelectric layer 112 that will not release before forming the third electrode 101. The first bridge 110 is formed by patterning a sacrificial material over the first electrode 107, and releasing the sacrificial material as described above.

Figure 1E:
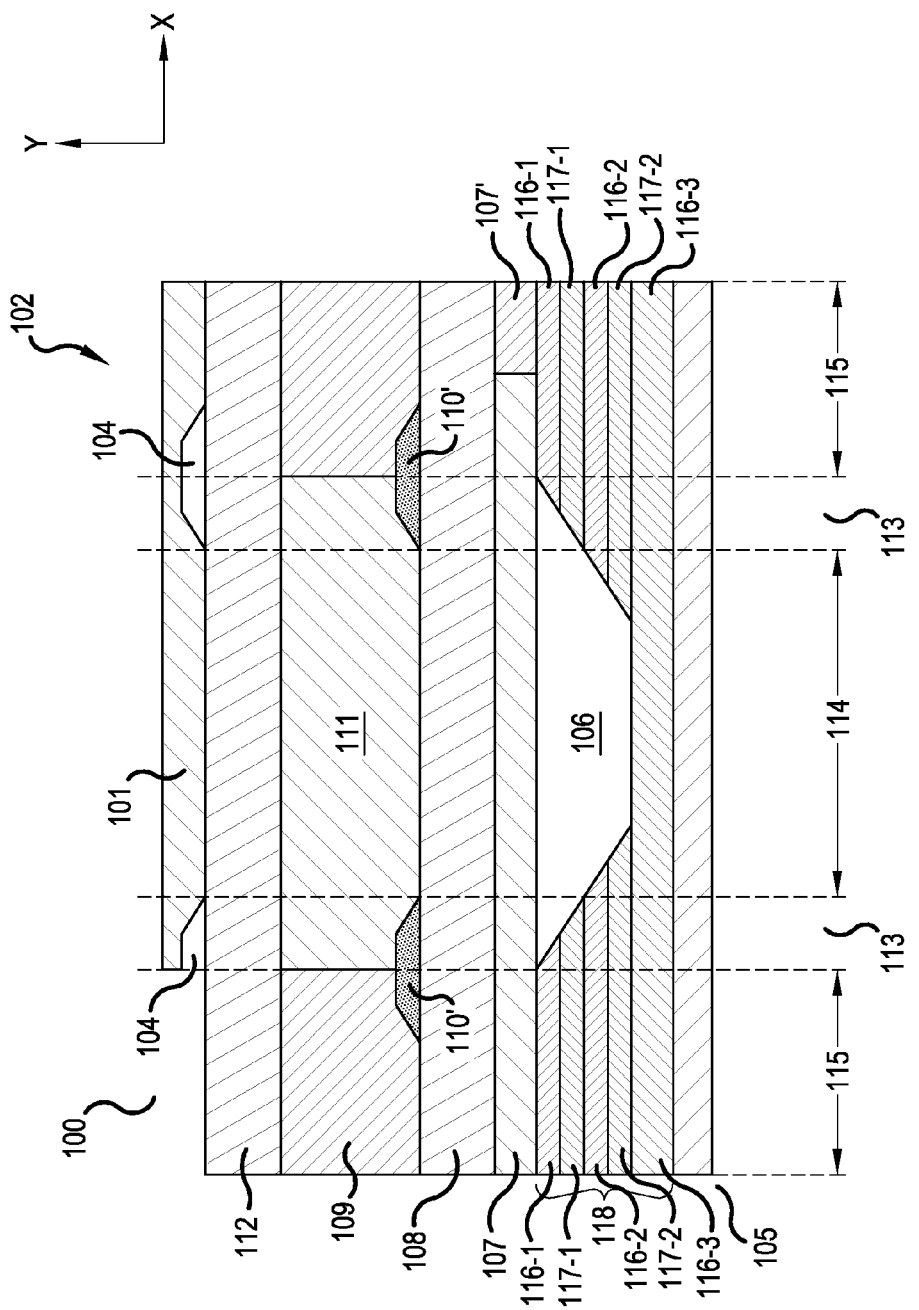

FIG. 1E shows a cross-sectional view of DBAR 100 including the DBR 118 in accordance with another representative embodiment. In the DBAR 100 depicted in FIG. 1E the second bridge 104 is filled with air, and the first bridge 110' is filled with a material to provide the acoustic impedance discontinuity to reduce losses. This modification of the DBAR 100 is fabricated by patterning a material (e.g., NEBSG) over the first piezoelectric layer 108 that will not release before forming the second electrode 111. The second bridge 104 is formed by patterning a sacrificial material over the first piezoelectric layer 108, and releasing the sacrificial material as described above.

Embodiments Comprising a Single Bridge

In the embodiments described presently, a single bridge is provided in an illustrative DBAR. The single bridge is provided at a single layer in each embodiment, and forms a perimeter that encloses the active region of the DBAR. By placing the bridge under different layers, the various embodiments can be studied to test the degree of coupling of modes in the active region (DBAR region) and the modes in the field region. Generally, the bridge decouples modes with a comparatively large propagation constant ($k_r$) from the modes in the field region. As described below, certain embodiments comprise a "filled" bridge and certain embodiments comprise an "unfilled" bridge. Many details of the present embodiments are common to those described above in connection with the representative embodiments of FIGS. 1A-1F. Generally, the common details are not repeated in the description of embodiments comprising a single bridge.

Figure 2A:
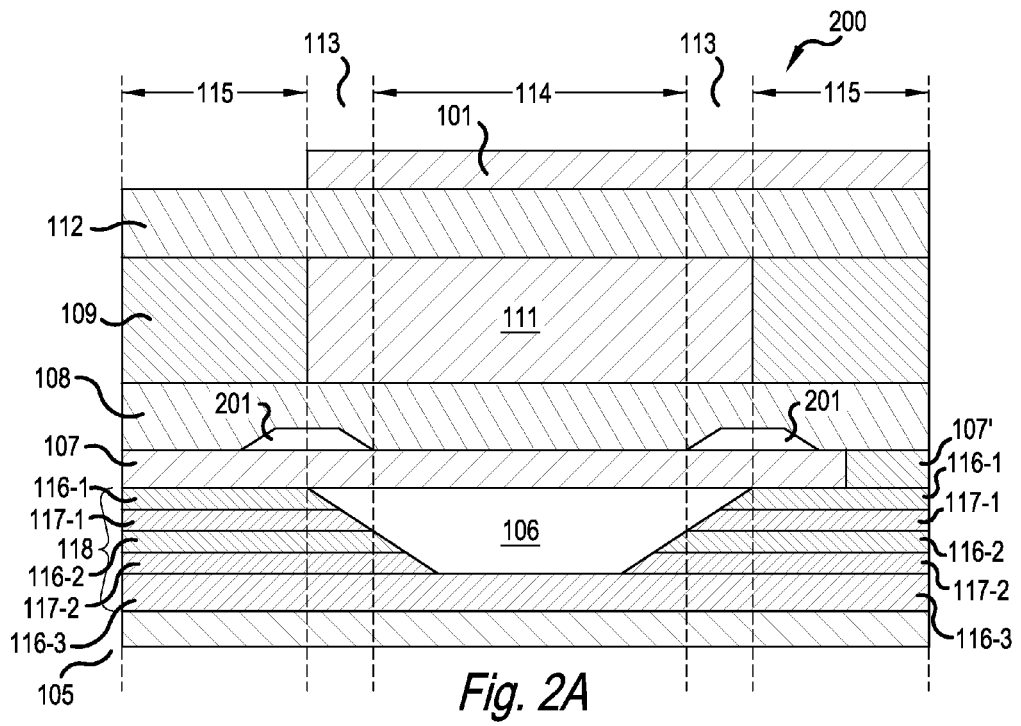
FIGS. 2B~2B are cross-sectional views of DBARs in accordance with a representative embodiment.
Figure 2B:
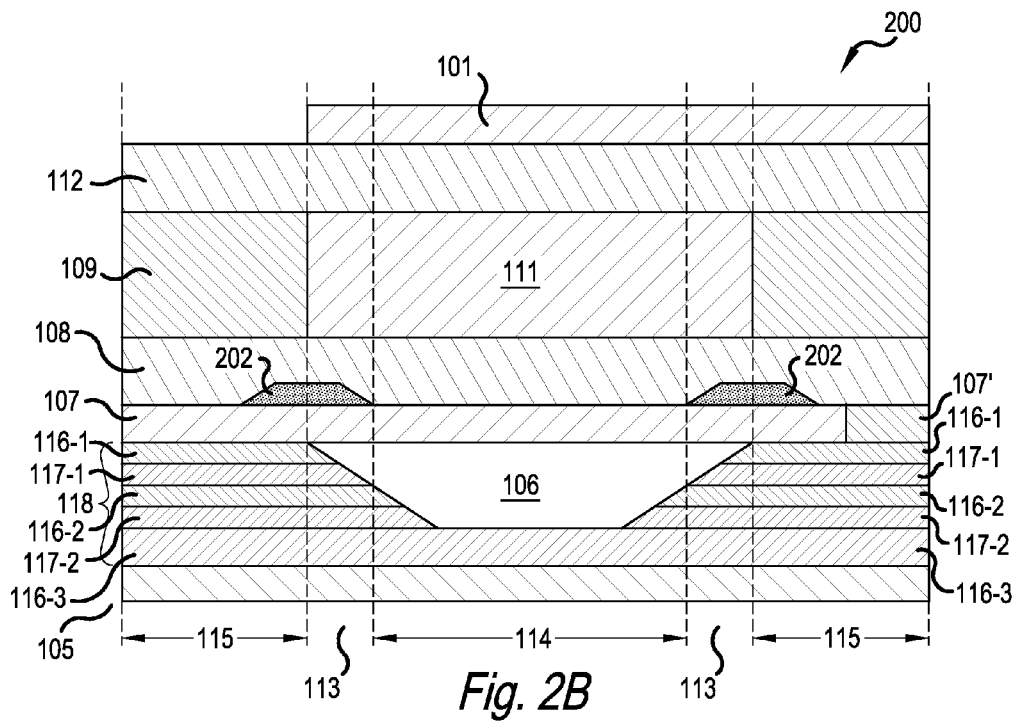

FIGS. 2A~B show cross-sectional views of a DBAR 200 in accordance with a representative embodiment. The DBAR 200 depicted in FIGS. 2A~2B comprises the DBR 118 described in detail above. The DBR 118 comprises materials and is fabricated in accordance with representative embodiments described above. Generally, the details of the DBR 118 are not repeated to prevent obscuring the description of the representative embodiments. A bridge 201 provided in the first piezoelectric layer 108. The bridge 201 is unfilled (i.e., filled with air). Bridge 201 is disposed around the perimeter of the active region 114 of the DBAR 200, and fosters confinement of modes in the active region 114 of the DBAR 200. For purposes of illustration of the improvement in mode confinement in the active region 114 of the DBAR 200, bridge 201 having a width (x-dimension) of approximately 5.5 μm, a height of 500 Å, and overlap 113 of the cavity 106 by 5.0 μm was provided. An increase in $Q_o$ of approximately 200% (depending on frequency of operation, e.g. at 0.87 GHz) is expected compared to a known DBAR that does not include a bridge FIG. 2B shows a bridge 202 provided in the first piezoelectric layer 108 of DBAR 200. The bridge 202 is "filled" with a material (e.g., NEBSG or other material described above) to provide an acoustic impedance discontinuity. Bridge 202 is disposed around the perimeter of the active region 114 of the DBAR 200, and fosters confinement of modes in the active region 114 of the DBAR 200. Similar improvements in $Q_o$ expected for bridge 201 are expected with the use of bridge 202. Beneficially, the use of a filled bridge provides a more rugged structure.

Figure 3A:
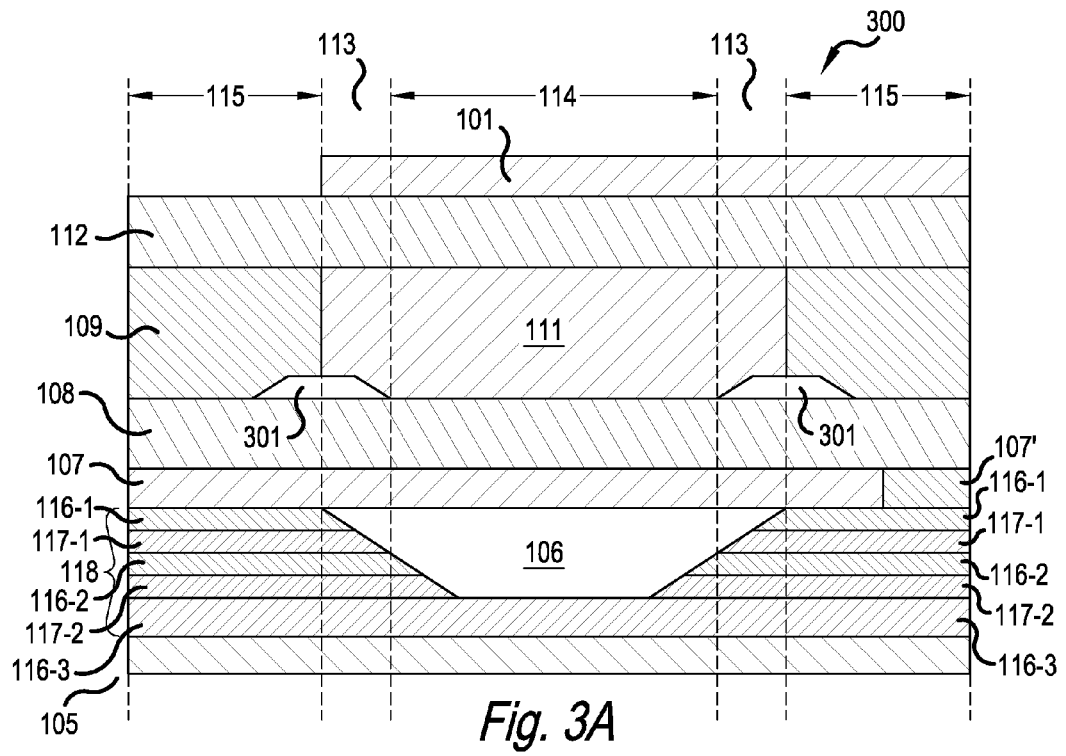
FIGS. 3A~3B are cross-sectional views of DBARs in accordance with a representative embodiment.
Figure 3B:
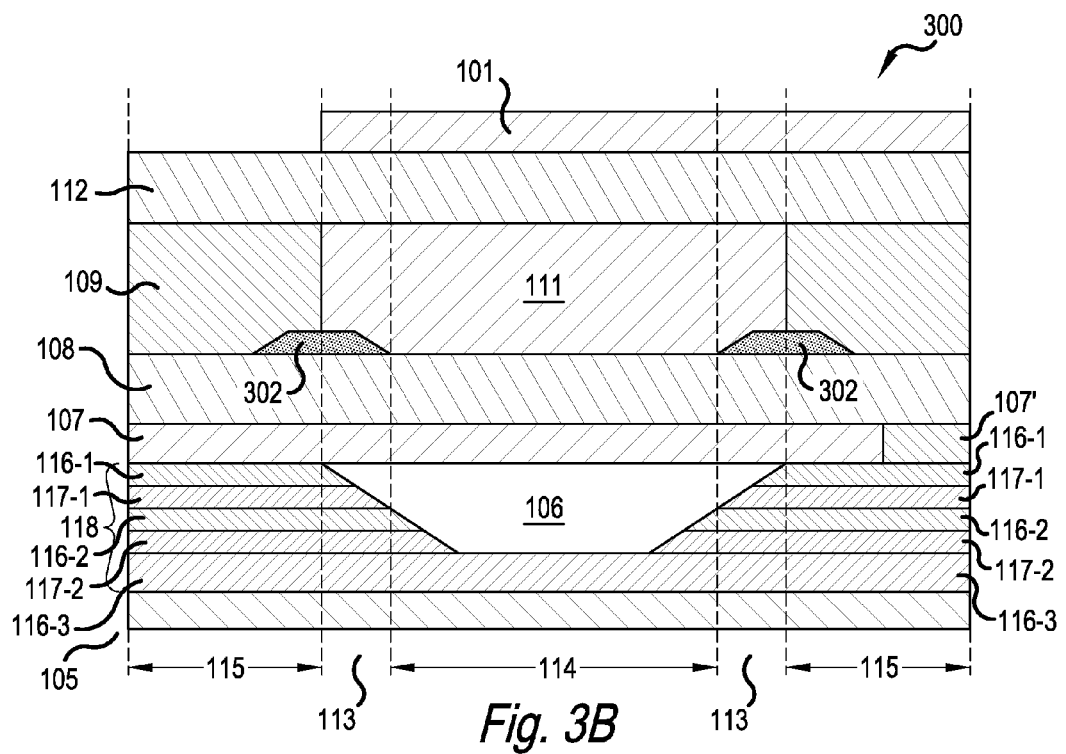

FIGS. 3A~3B show a cross-sectional view of a DBAR 300 in accordance with a representative embodiment. The DBAR 300 comprises a plurality of layers disposed over a substrate 105 having a cavity 106. The DBAR 300 also comprises the DBR 118 described in detail above. Many aspects of the DBAR 300 are common to those of DBARs 100, 200, described above, and are not repeated in order to avoid obscuring the description of the representative embodiments presently described.

FIG. 3A shows a bridge 301 provided in the second electrode Ill and into the planarization layer 109. The bridge 301 is unfilled (i.e., filled with air). Bridge 301 is disposed along the perimeter of the active region 114 of the DBAR 300, and fosters confinement of modes in the active region 114 of the DBAR 300. For purposes of illustration of the improvement in mode confinement in the active region 114 of the DBAR 200, bridge 201 having a width (x-dimension) of approximately 5.5 µm, a height of 500 Å, and overlap 113 of the cavity 106 by 5.0 µm was provided. An increase in $Q_o$ of approximately 200% (depending on frequency of operation, e.g. at 0.87 GHz) is expected compared to a known DBAR that does not include a bridge.

FIG. 3B shows a bridge 302 provided in the second electrode 111. The bridge 302 is "filled" with a material (e.g., NEBSG or other material described above) to provide an acoustic impedance discontinuity. Bridge 302 is disposed along the perimeter of the active region 114 of the DBAR 300, and fosters confinement of modes in the active region 114 of the DBAR 300. For bridge 302 having the same width, height and overlap 113 of cavity 106 as bridge 301, similar improvements in $Q_o$ expected for bridge 301 are expected with the use of bridge 302. Beneficially, the use of a filled bridge provides a more rugged structure.

Figure 4A:
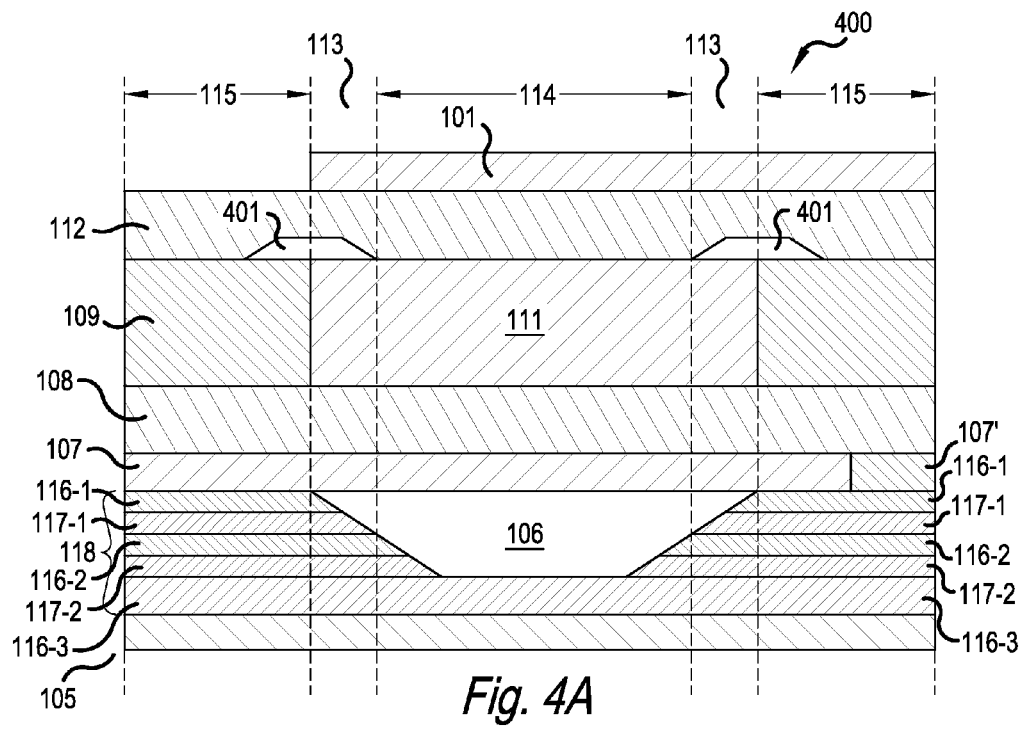
FIGS. 4A~4B are cross-sectional views of DBARs in accordance with a representative embodiment.
Figure 4B:
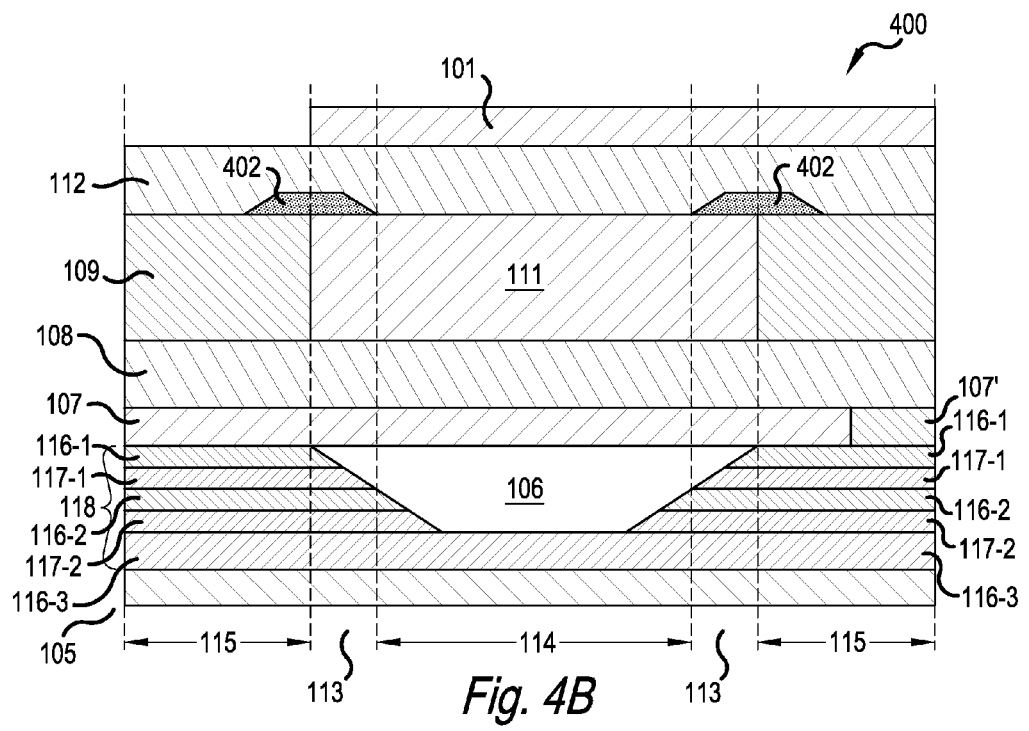

FIGS. 4A~4B show cross-sectional views of a DBAR 400 in accordance with a representative embodiment. The DBAR 400 comprises a plurality of layers disposed over a substrate 105 having a cavity 106. The DBAR 400 also comprises the DBR 118 described in detail above. Many aspects of the DBAR 400 are common to those of DBARs 100~300, and are not repeated in order to avoid obscuring the description of the representative embodiments presently described.

FIG. 4A shows a bridge 401 provided in the second piezoelectric layer 112. The bridge 401 is unfilled (i.e., filled with air). Bridge 401 is disposed around the perimeter of the active region 114 of the DBAR 400, and fosters confinement of modes in the active region of the DBAR 400. For purposes of illustration of the improvement in mode confinement in the active region 114 of the DBAR 400, bridge 401 having a width (x-dimension) of approximately 5.5 µm, a height of 500 Å, and overlap 113 of the cavity 106 by 5.0 µm was provided. An increase in $Q_o$ of approximately 200% (depending on frequency of operation, e.g. at 0.87 GHz) is expected compared to a known DBAR that does not include a bridge.

FIG. 4B shows a bridge 402 provided in the second piezoelectric layer 112. The bridge 402 is "filled" with a material (e.g., NEBSG or other material described above) to provide an acoustic impedance discontinuity. Bridge 402 is disposed around the perimeter of the active region 114 of the DBAR 400, and fosters confinement of modes in the active region 114 of the DBAR 400. For bridge 402 having the same width, height and overlap 113 of cavity 106 as bridge 401, similar improvements in $Q_o$ expected for bridge 401 are expected with the use of bridge 402. Beneficially, the use of a filled bridge provides a more rugged structure.

Figure 5A:
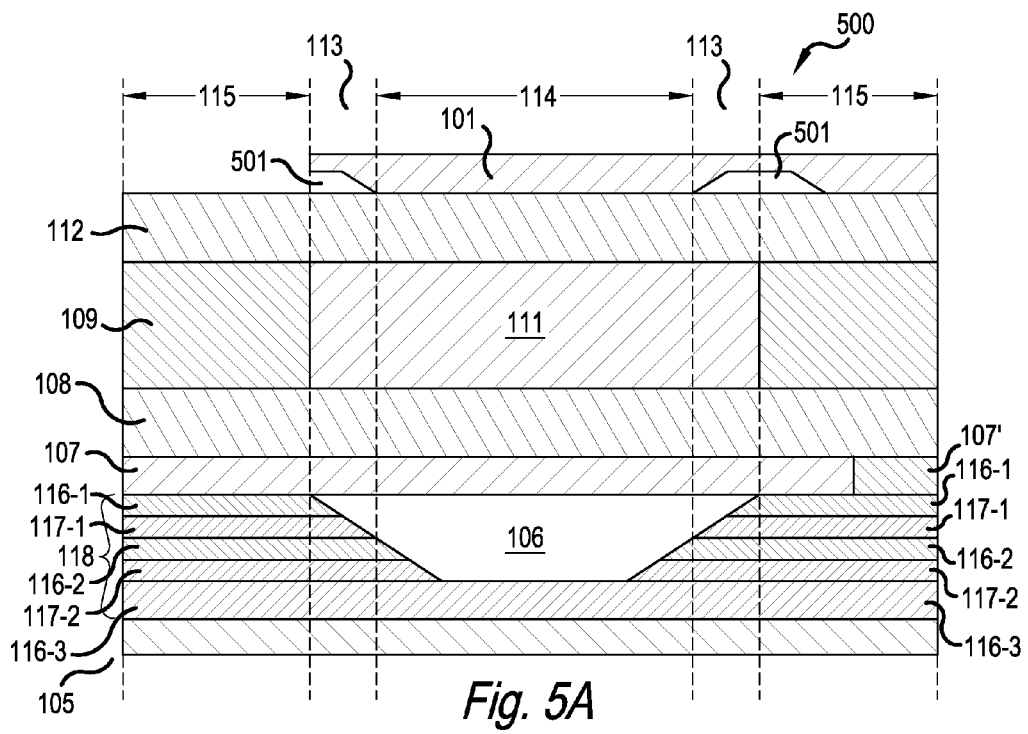
FIGS. 5A~5B are cross-sectional views of DBARs in accordance with a representative embodiment.
Figure 5B:
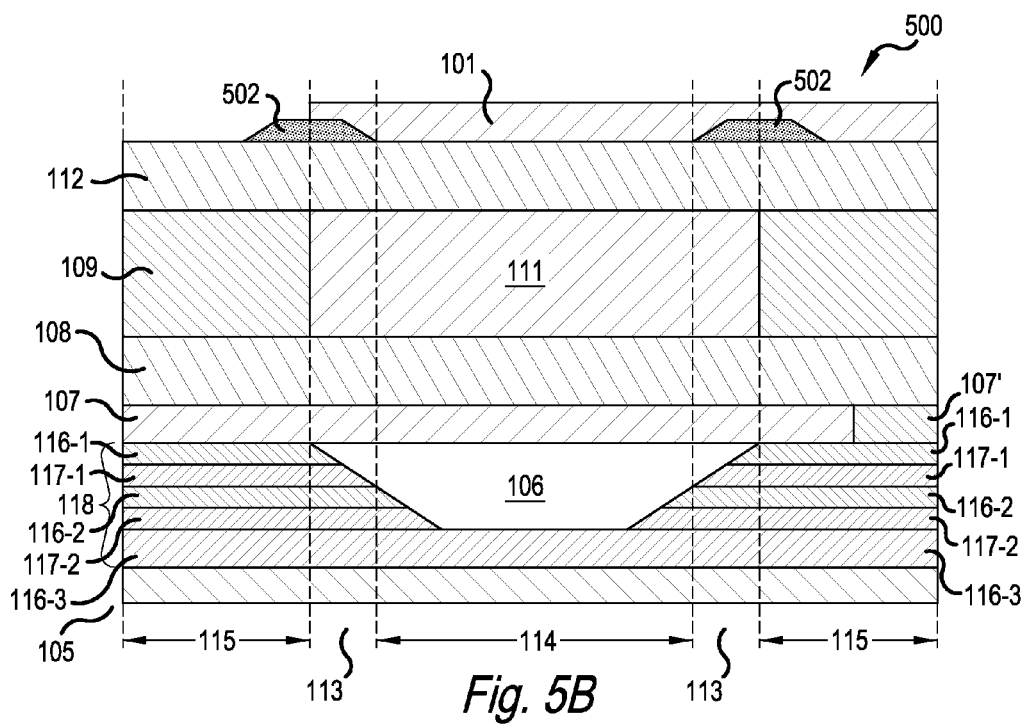

FIGS. 5A~5B show a cross-sectional view of a DBAR 500 in accordance with a representative embodiment. The DBAR 500 comprises a plurality of layers disposed over a substrate 105 having a cavity 106. The DBAR 500 also comprises the DBR 118 described in detail above. Many aspects of the DBAR 500 are common to those of DBARs 100-400, and are not repeated in order to avoid obscuring the description of the representative embodiments presently described.

FIG. 5A shows a bridge 501 provided in the third electrode 101. The bridge 501 is unfilled (i.e., filled with air). Bridge 501 is disposed around the perimeter of the active region 114 of the DBAR 500, and fosters confinement of modes in the active region 114 of the DBAR 500. For purposes of illustration of the improvement in mode confinement in the active region 114 of the DBAR 500, bridge 501 having a width (x-dimension) of approximately 5.5 µm, a height of 500 Å, and overlap 113 of the cavity 106 by 2.0 µm was provided. An increase in $Q_o$ of approximately 200% (depending on frequency of operation, e.g. at 0.87 GHz) is expected compared to a known DBAR that does not include a bridge.

FIG. 5B shows a bridge 502 provided in the third electrode 101. The bridge 502 is "filled" with a material (e.g., NEBSG or other material described above) to provide an acoustic impedance discontinuity. Bridge 502 is disposed along the perimeter of the active region 114 of the DBAR 500, and fosters confinement of modes in the active region 114 of the DBAR 500. For bridge 502 having the same width, height and overlap 113 of cavity 106 as bridge 501, similar improvements in $Q_o$ expected for bridge 501 are expected with the use of bridge 502. Beneficially, the use of a filled bridge provides a more rugged structure.

Embodiments Comprising Two Bridges

In the embodiments described presently, two bridges are provided in an illustrative DBAR. One bridge is provided in one layer of the DBAR and a second bridge is provided in another layer of the DBAR in each embodiment. The bridges are generally concentric, although not circular in shape, and are disposed about a perimeter that encloses the active region of the DBAR. By placing the bridges under different combinations of layers, the various embodiments can be studied to test the degree of coupling of modes in the active region 114 (DBAR region) and the modes in the field region 115. Generally, the bridge decouples modes with a comparatively large propagation constant ($k_r$) from the modes in the field region 115. As described below, certain embodiments comprise a "filled" bridge and certain embodiments comprise an "unfilled" bridge.

FIGS. 6A~6D show a cross-sectional view of a DBAR 600 in accordance with a representative embodiment. The DBAR 600 comprises a plurality of layers disposed over a substrate 105 having a cavity 106. The DBAR 600 also comprises the DBR 118 described in detail above. Many aspects of the DBAR 600 are common to those of DBARs 100~500, and are not repeated in order to avoid obscuring the description of the representative embodiments presently described.

Figure 6A:
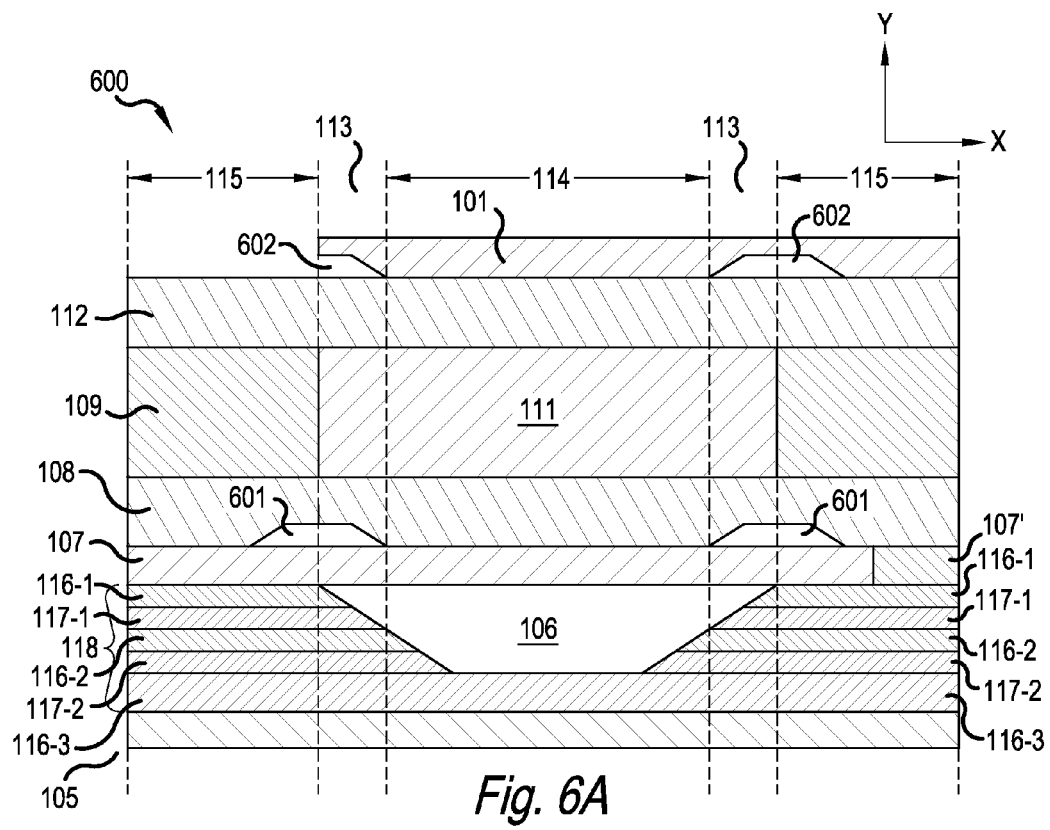
FIGS. 6A~6D are cross-sectional views of DBARs in accordance with a representative embodiment.

FIG. 6A shows a first bridge 601 provided in the first piezoelectric layer 108. The first bridge 601 is unfilled (i.e., filled with air). A second bridge 602 is provided in the third electrode 101. The second bridge 602 is unfilled (i.e., filled with air). First and second bridges 601, 602 are disposed along the perimeter of the active region 114 of the DBAR 600, and foster confinement of modes in the active region of the DBAR 600. For purposes of illustration of the improvement in mode confinement in the active region of the DBAR 600, first and second bridges 601, 602 each having a width (x-dimension) of approximately 5.5 μm, a height of 500 Å, and overlap 113 the cavity 106 by 5.0 μm are provided. Compared to a known DBAR without bridges (depending on frequency of operation, e.g. at 0.87 GHz), an improvement of approximately 400% in $Q_o$ for the DBAR 600 is expected due to the increased confinement of an odd mode in the DBAR 600 by use of first and second bridges 601, 602 of the representative embodiment.

Figure 6B:
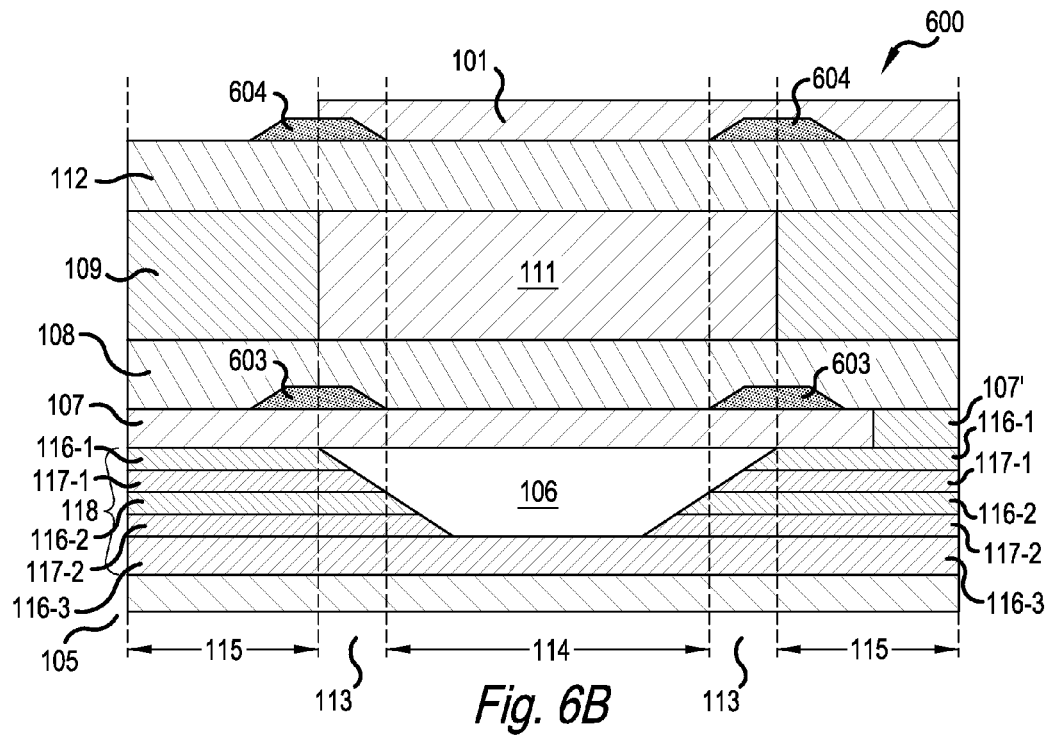

FIG. 6B shows a first bridge 603 provided in the first piezoelectric layer 108. The first bridge 603 is filled (e.g., filled with NEBSG). A second bridge 604 is provided in the third electrode 101. The second bridge 804 is also filled. First and second bridges 603, 604 are disposed around the perimeter of the active region of the DBAR 600, and foster confinement of modes in the active region of the DBAR 600. For first and second bridges 603, 604 having the same width, height and overlap 113 of cavity 106 as first and second bridges 601, 602 similar improvements in $Q_o$ expected for first and second bridges 601, 602 are expected with the use of first and second bridges 603, 604. Beneficially, the use of filled bridges provides a more rugged structure.

Figure 6C:
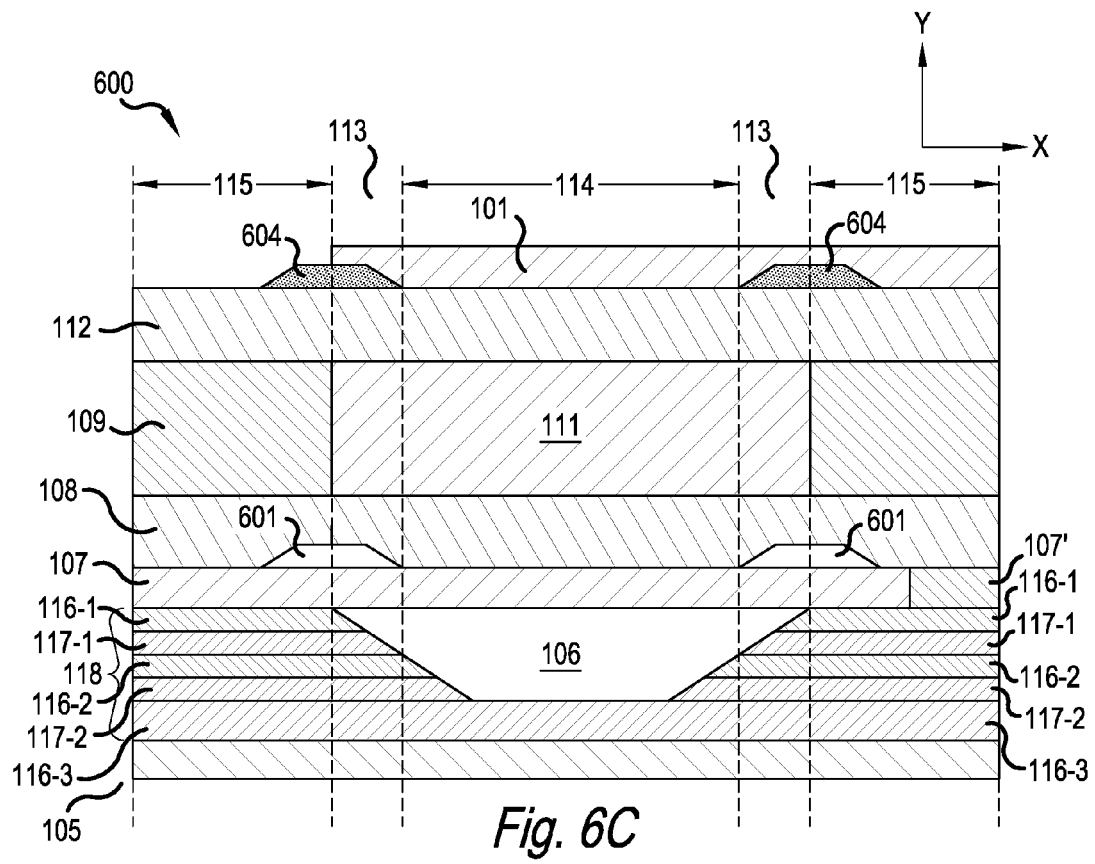

FIG. 6C shows a first bridge 601 provided in the first piezoelectric layer 108. The first bridge 601 is unfilled (i.e., filled with air). Second bridge 604 is provided in the third electrode 101. The second bridge 604 is filled. First and second bridges 601, 604 are disposed around the perimeter of the active region 114 of the DBAR 600, and foster confinement of modes in the active region 114 of the DBAR 600. For first and second bridges 601, 604 having the same width, height and overlap 113 of cavity 106 as first and second bridges 601, 602 similar improvements in $Q_o$ expected for first and second bridges 601, 602 are expected with the use of first and second bridges 601, 604. Beneficially, the use of a filled bridge provides a more rugged structure.

Figure 6D:
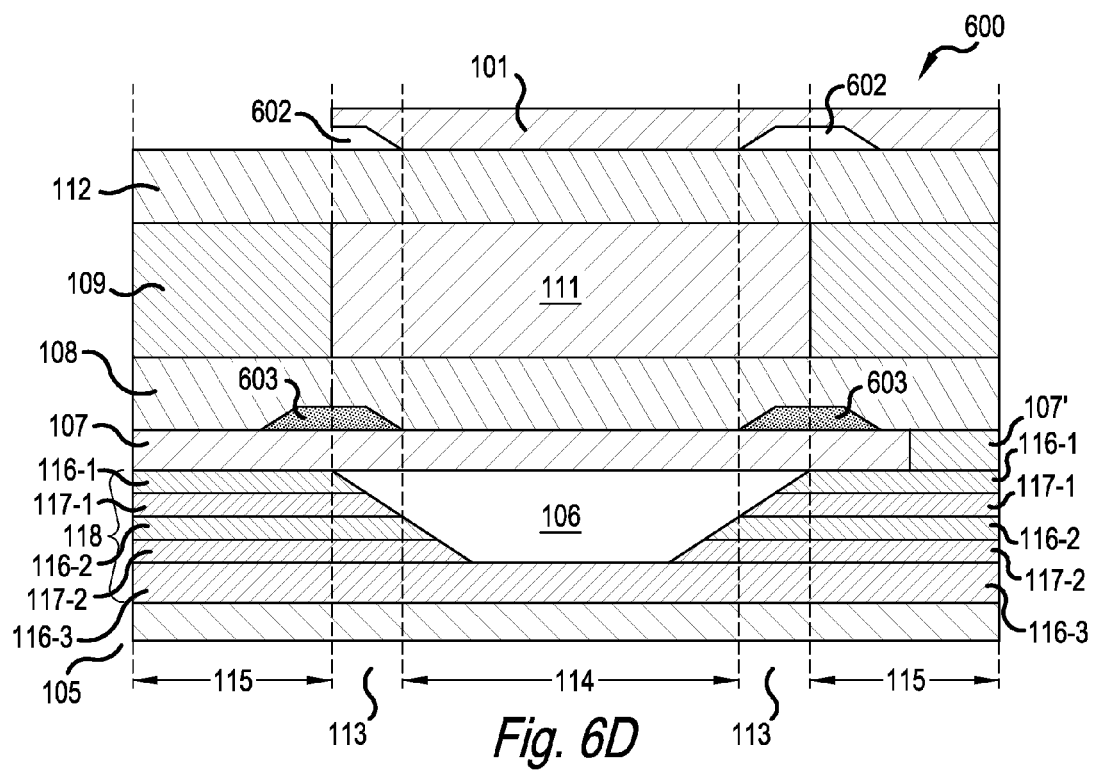

FIG. 6D shows first bridge 603 provided in the first piezoelectric layer 108. The first bridge 603 is filled. A second bridge 602 is provided in the third electrode 101. The second bridge 602 is unfilled (i.e., filled with air). First and second bridges 603, 602 are disposed along the perimeter of the active region 114 of the DBAR 600, and foster confinement of modes in the active region 114 of the DBAR 600. For first and second bridges 603, 602 having the same width, height and overlap 113 of cavity 106 as first and second bridges 601, 602, similar improvements in $Q_o$ expected for first and second bridges 601, 602 are expected with the use of first and second bridges 603, 602. Beneficially, the use of a filled bridge provides a more rugged structure.

FIGS. 7A-7D show cross-sectional views of a DBAR 700 in accordance with a representative embodiment. The DBAR 700 comprises a plurality of layers disposed over a substrate 105 having a cavity 106. The DBAR 300 also comprises the DBR 118 described in detail above. Many aspects of the DBAR 700 are common to those of DBARs 100-600, and are not repeated in order to avoid obscuring the description of the representative embodiments presently described.

Figure 7A:
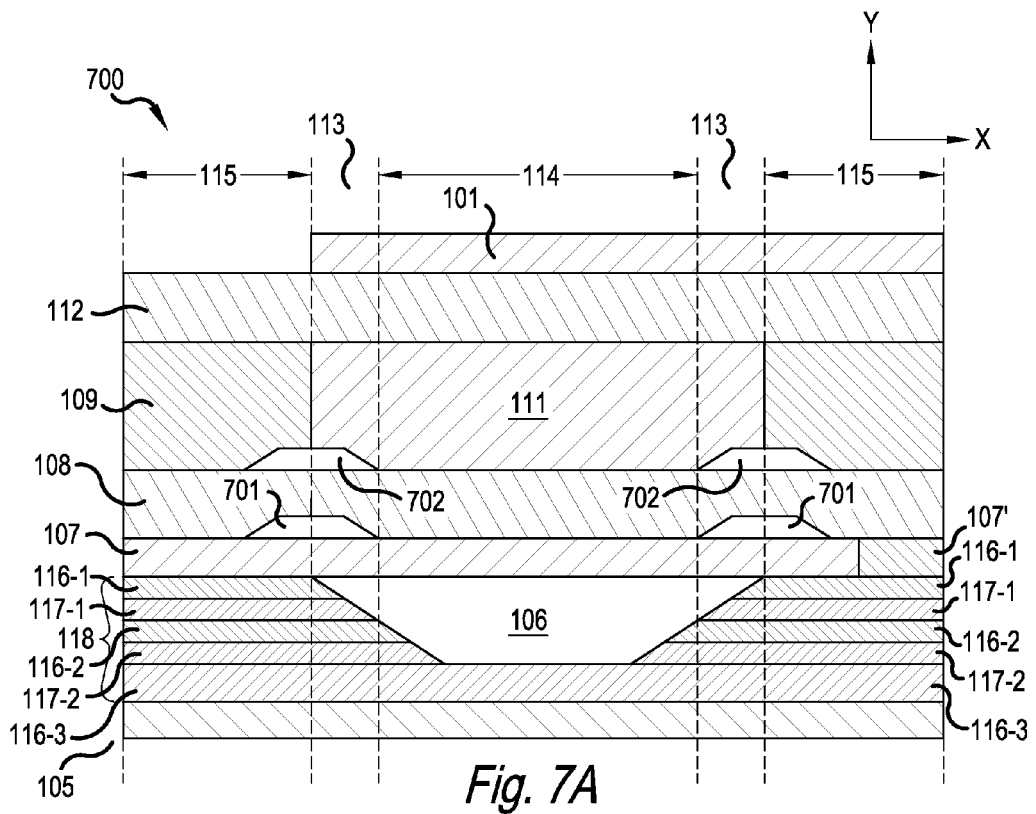
FIGS. 7A~7D are cross-sectional views of DBARs in accordance with a representative embodiment.

FIG. 7A shows a first bridge 701 provided in the first piezoelectric layer 108. The first bridge 701 is unfilled (i.e., filled with air). A second bridge 702 is provided in the second electrode 111 and extends partially into the planarization layer 109. The second bridge 702 is unfilled (i.e., filled with air). First and second bridges 701, 702 are disposed along the perimeter of the active region 114 of the DBAR 700, and foster confinement of modes in the active region 114 of the DABR. For purposes of illustration of the improvement in mode confinement in the active region of the DBAR 700, first and second bridges 701, 702 each have a width (x-dimension) of approximately 5.5 μm, a height of 500 Å, and overlap 113 the cavity 106 by 5.0 μm. Compared to a known DBAR without bridges (depending on frequency of operation, e.g. at 0.87 GHz), an improvement of approximately 400% in $Q_o$ for the DBAR 700 is expected due to the increased confinement of an odd mode in the DBAR 700 by use of first and second bridges 701, 702 of the representative embodiment.

Figure 7B:
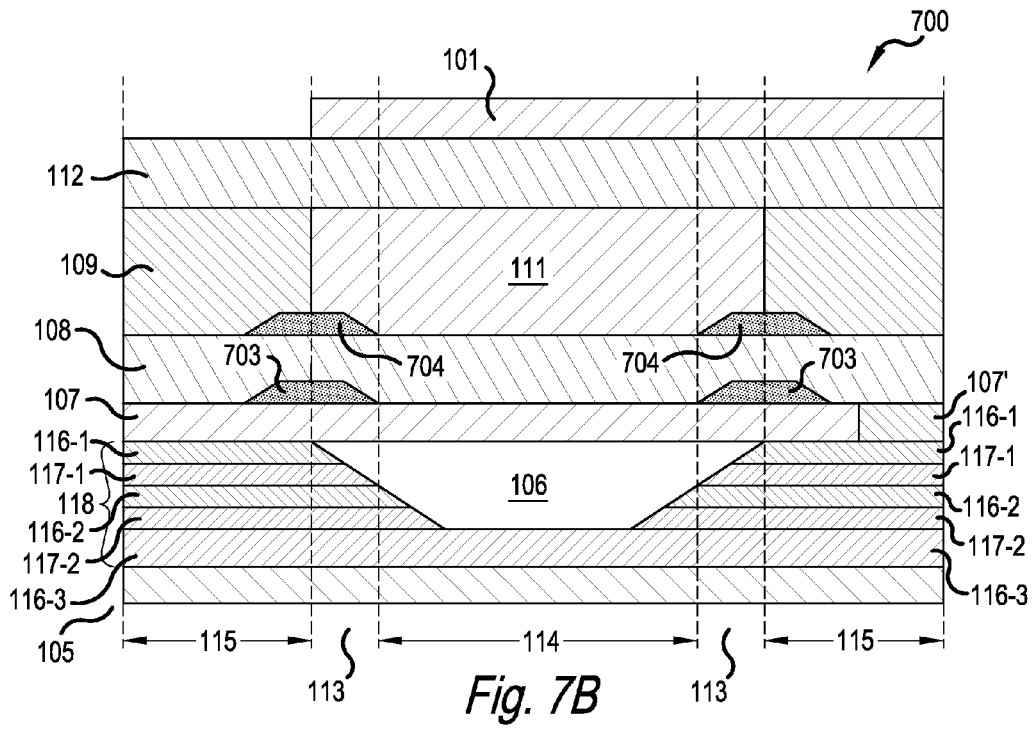

FIG. 7B shows a first bridge 703 provided in the first piezoelectric layer 108. The first bridge 703 is filled. A second bridge 704 is provided in the second electrode 111 and extends partially into the planarization layer 109. The second bridge 704 is filled. First and second bridges 703, 704 are disposed along the perimeter of the active region 114 of the DBAR 700, and foster confinement of modes in the active region 114 of the DBAR 700. For first and second bridges 703, 704 having the same width, height and overlap of cavity 106 as first and second bridges 701, 702, similar improvements in $Q_o$ expected for first and second bridges 701, 702 are expected with the use of first and second bridges 703, 704. Beneficially, the use of a filled bridge provides a more rugged structure.

Figure 7C:
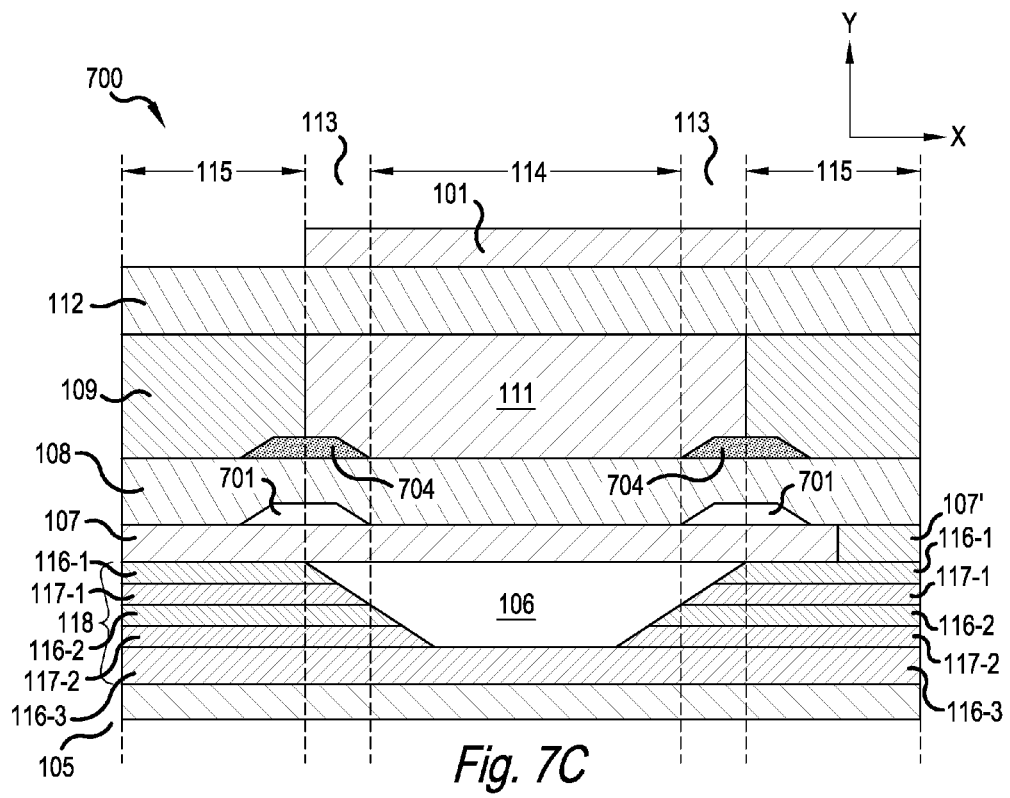

FIG. 7C shows first bridge 701 provided in the first piezoelectric layer 108. The first bridge 701 is unfilled (i.e., filled with air). Second bridge 704 is provided in the second electrode 111 and extends partially into the planarization layer 109. The second bridge 704 is filled. First and second bridges 701, 704 are disposed along the perimeter of the active region of the DBAR 700, and foster confinement of modes in the active region of the DBAR 700. For first and second bridges 701, 704 having the same width, height and overlap of cavity 106 as first and second bridges 701, 702, similar improvements in $Q_o$ expected for first and second bridges 701, 702 are expected with the use of first and second bridges 701, 704. Beneficially, the use of a filled bridge provides a more rugged structure.

Figure 7D:
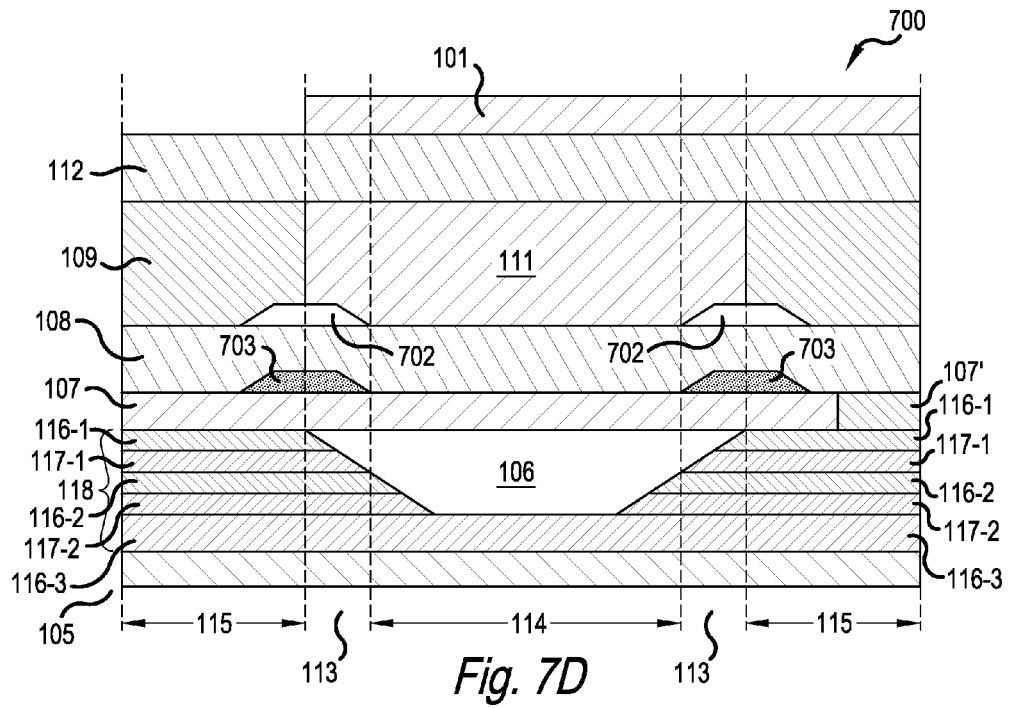

FIG. 7D shows first bridge 703 provided in the first piezoelectric layer 108. The first bridge 703 is filled. Second bridge 702 is provided in the second electrode 111 and extends partially into the planarization layer 109. The second bridge 702 is unfilled (i.e., filled with air). First and second bridges 703, 702 are disposed around the perimeter of the active region of the DBAR 700, and foster confinement of modes in the active region 114 of the DBAR 700. For first and second bridges 703, 702 having the same width, height and overlap of cavity 106 as first and second bridges 701, 702, similar improvements in $Q_o$ expected for first and second bridges 701, 702 are expected with the use of first and second bridges 703, 702. Beneficially, the use of a filled bridge provides a more rugged structure.

FIGS. 8A-8D show cross-sectional views of a DBAR 800 in accordance with a representative embodiment. The DBAR 800 comprises a plurality of layers disposed over a substrate 105 having a cavity 106. The DBAR 800 also comprises the DBR 118 described in detail above. Many aspects of the DBAR 800 are common to those of DBARs 100-700, and are not repeated in order to avoid obscuring the description of the representative embodiments presently described.

Figure 8A:
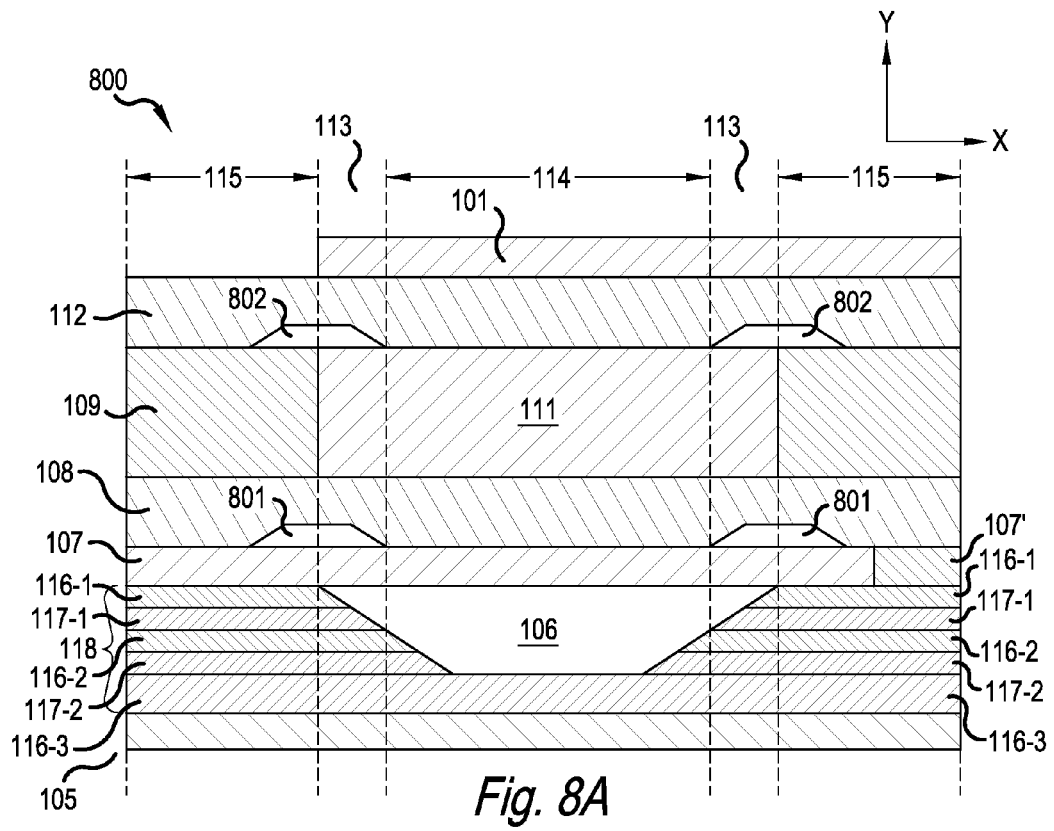
FIGS. 8A~8D are cross-sectional views of DBARs in accordance with a representative embodiment.

FIG. 8A shows a first bridge 801 provided in the first piezoelectric layer 108. The first bridge 801 is unfilled (i.e., filled with air). A second bridge 802 is provided in the second piezoelectric layer 112. The second bridge 802 is unfilled (i.e., filled with air). First and second bridges 801, 802 are disposed along the perimeter of the active region 114 of the DBAR 800, and foster confinement of modes in the active region 114 of the DBAR 800. For purposes of illustration of the improvement in mode confinement in the active region of the DBAR 800, first and second bridges 801, 802 each having a width (x-dimension) of approximately 5.5 µm, a height of 500 Å, and overlap 113 of the cavity 106 by 5.0 µm are provided. Compared to a known DBAR without bridges (depending on frequency of operation, e.g. at 0.87 GHz), an improvement of approximately 400% in $Q_o$ for the DBAR 800 is expected due to the increased confinement of an odd mode in the DBAR 800 by use of first and second bridges 801, 802 of the representative embodiment.

Figure 8B:
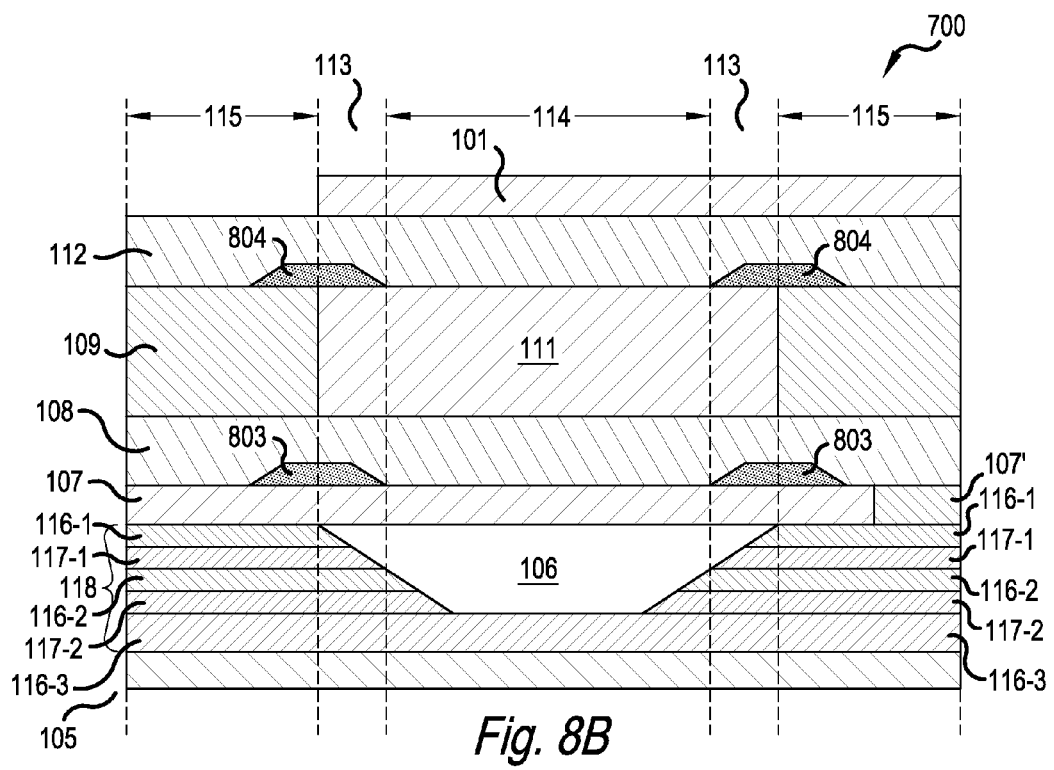

FIG. 8B shows a first bridge 803 provided in the first piezoelectric layer 108. The first bridge 803 is filled. Second bridge 804 is provided in the second piezoelectric layer 112. The second bridge 804 is filled. First and second bridges 803, 804 are disposed along the perimeter of the active region 114 of the DBAR 800, and foster confinement of modes in the active region of the DBAR 800. For first and second bridges 803, 804 having the same width, height and overlap 113 of cavity 106 as first and second bridges 801, 802, similar improvements in $Q_o$ expected for first and second bridges 801, 802 are expected with the use of first and second bridges 803, 804. Beneficially, the use of a filled bridge provides a more rugged structure.

Figure 8C:
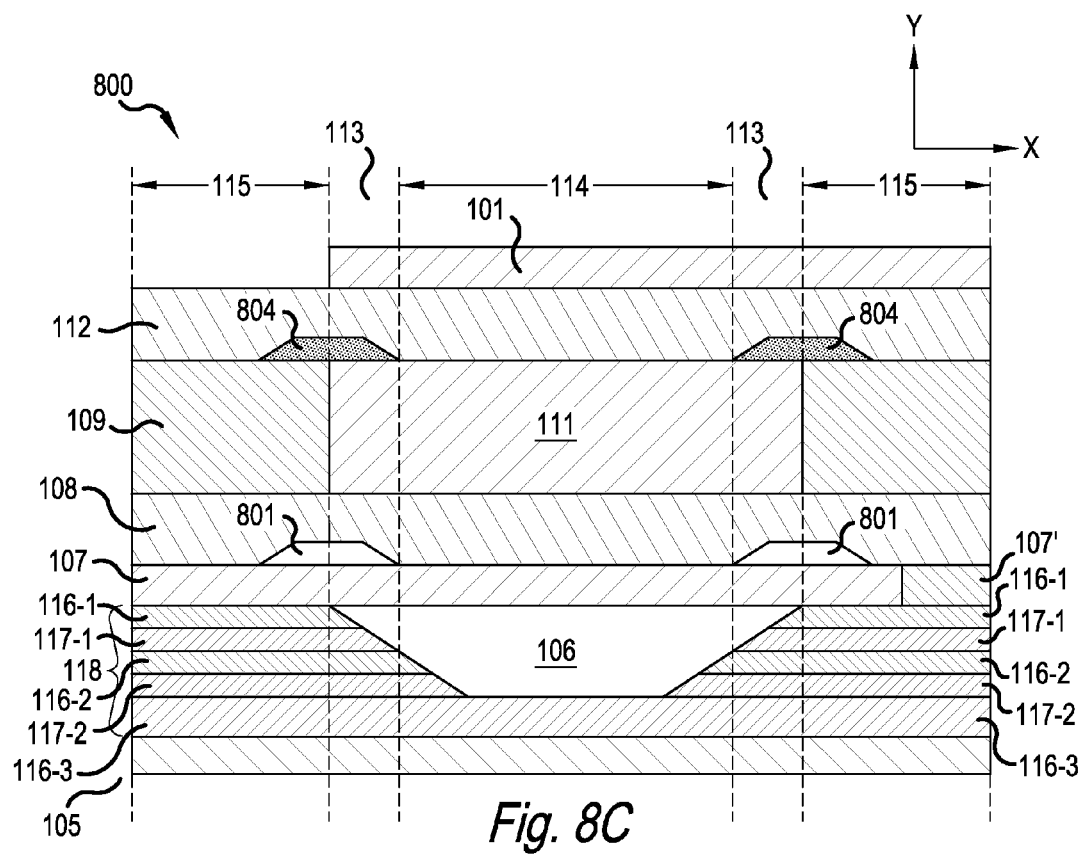

FIG. 8C shows first bridge 801 provided in the first piezoelectric layer 108. The first bridge 801 is unfilled. Second bridge 804 is provided in the second piezoelectric layer 112. The second bridge 804 is unfilled. First and second bridges 801, 804 are disposed along the perimeter of the active region 114 of the DBAR 800, and foster confinement of modes in the active region 114 of the DBAR 800. For first and second bridges 801, 804 having the same width, height and overlap 113 of cavity 106 as first and second bridges 801, 802, similar improvements in $Q_o$ expected for first and second bridges 801, 802 are expected with the use of first and second bridges 801, 804. Beneficially, the use of a filled bridge provides a more rugged structure.

Figure 8D:
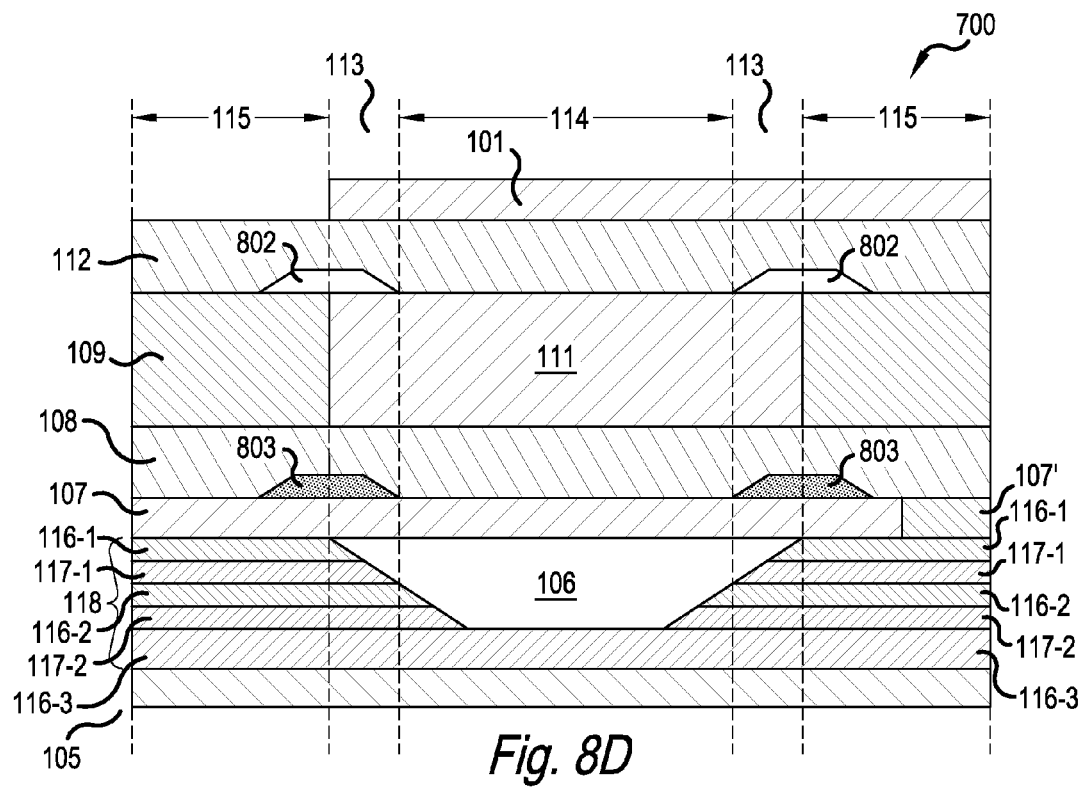

FIG. 8D shows first bridge 803 provided in the first piezoelectric layer 108. The first bridge 803 is filled. Second bridge 802 is provided in the second piezoelectric layer 112. The second bridge 802 is unfilled. First and second bridges 803, 802 are disposed along the perimeter of the active region 114 of the DBAR 800, and foster confinement of modes in the active region 114 of the DBAR 800. For first and second bridges 803, 802 having the same width, height and overlap 113 of cavity 106 as first and second bridges 801, 802, similar improvements in $Q_o$ expected for first and second bridges 801, 802 are expected with the use of first and second bridges 803, 802. Beneficially, the use of a filled bridge provides a more rugged structure.

Figure 8E:
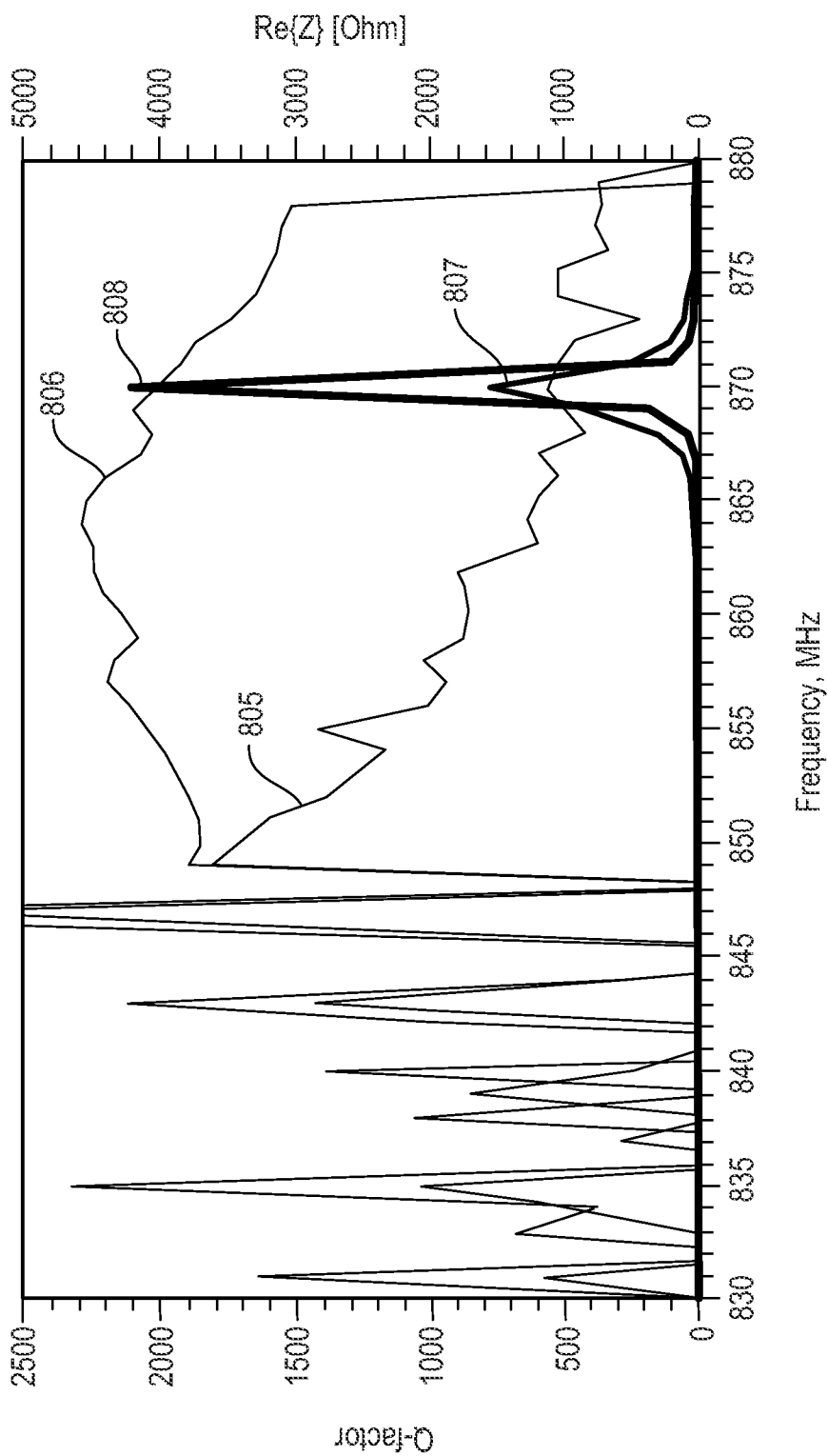
FIG. 8E is a graphical representation of the Q factor of an odd mode ($Q_o$) and impedance at parallel resonance frequency (Rp) of a known DBAR and of a DBAR in accordance with a representative embodiment.

FIG. 8E shows a comparison of simulated the odd mode Q ($Q_o$) versus frequency of DBAR 800 of the representative embodiment depicted in FIG. 8A and odd mode Q ($Q_o$) of a known DBAR. The Q factor affects roll-off of a filter comprising the DBAR 800, and varies according to various material properties of the DBAR 800, such as a series resistance Rs and a parallel resistance Rp, which correspond to various heat losses and acoustic losses of the DBAR 800. Generally, it is beneficial to maximize Q and Rp, and to minimize Rs for the most optimal insertion and rejection loss characteristics of the filter comprising DBARs 800.

As shown in FIG. 8A, the first and second bridges 110, 104 are released. For purposes of illustration of the improvement in mode confinement in the active region 114 of the DBAR 800, first and second bridges, 110, 104 having a width (x-dimension) of approximately 5.5 µm, a height of 2000 Å, and overlap 113 of 5.0 µm are provided. The DBR 118 comprises the first Bragg layers 116-1, 116-2, 116-3 made of PECVD-SiC having thickness approximately 1.8 µm and the second Bragg layers 117-1, 116-2 made of sputtered-SiC having thickness approximately 3 µm.

Curve 805 depicts $Q_o$ of a mode in a known DBAR (without bridges or DBR in accordance with representative embodiments) and curve 806 depicts $Q_o$ of a mode in DBAR 800 with first and second bridges (110, 104) released. Compared to the known DBAR that does not include a bridge or DBR 118, an increase in $Q_o$ of approximately 400% (depending on frequency of operation, e.g. at 0.87 GHz) is numerically predicted.

Curve 807 depicts Rp at parallel resonance Fp of a known DBAR (without bridges or DBR in accordance with representative embodiments) and curve 808 depicts Rp at parallel resonance Fp of a mode in DBAR 800 with first and second bridges (110, 104) released. As can be appreciated, Rp of DBAR 800 peaks at approximately 4200, and Rp of the known DBAR peaks at approximately 1400. As such, an improvement of approximately 300% is realized through the implementations various features of the DBAR 800 of the present teachings.

FIGS. 9A–9D show cross-sectional views of a DBAR 900 in accordance with a representative embodiment. The DBAR 900 comprises a plurality of layers disposed over a substrate 105 having a cavity 106. The DBAR 900 also comprises the DBR 118 described in detail above. Many aspects of the DBAR 900 are common to those of DBARs 100-800, and are not repeated in order to avoid obscuring the description of the representative embodiments presently described.

Figure 9A:
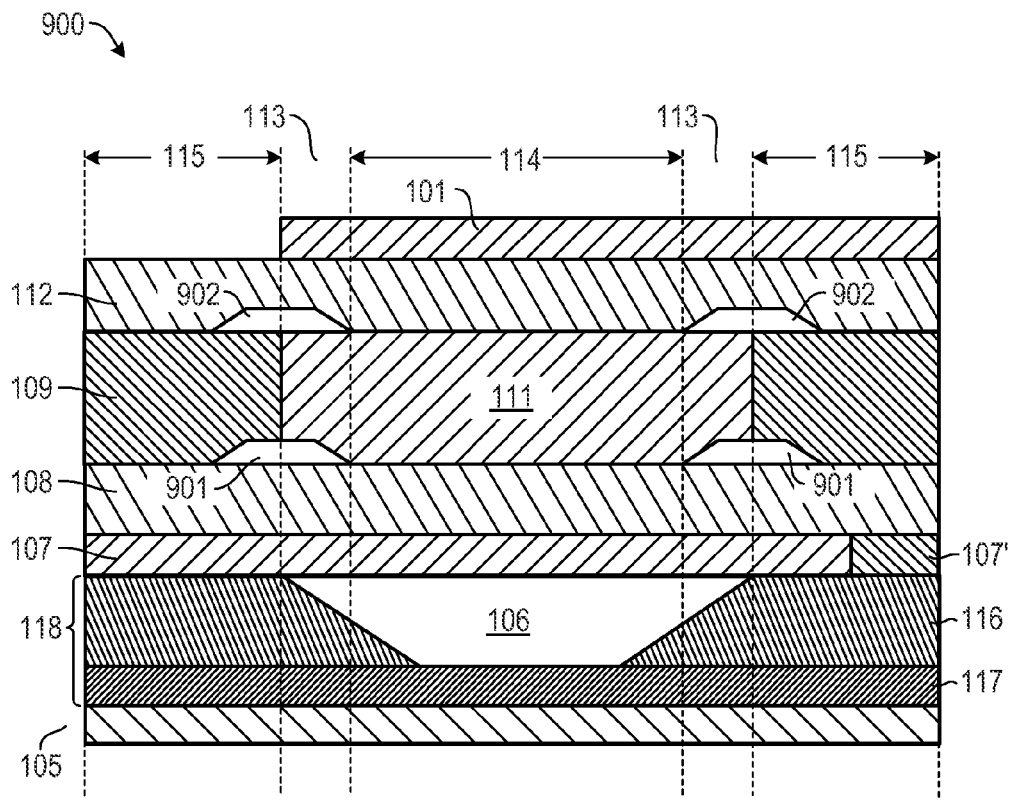
FIGS. 9A~9D are cross-sectional views of DBARs in accordance with a representative embodiment.

FIG. 9A shows a first bridge 901 provided in the second electrode 111 and extending partially into the planarization layer 109. The first bridge 901 is unfilled (i.e., filled with air). A second bridge 902 is provided in the second piezoelectric layer 112. The second bridge 902 is unfilled (i.e., filled with air). First and second bridges 901, 902 are disposed along the perimeter of the active region 114 of the DBAR 900, and foster confinement of modes in the active region 114 of the DBAR 900. For purposes of illustration of the improvement in mode confinement in the active region of the DBAR 900, first and second bridges 901, 902 each having a width (x-dimension) of approximately 5.5 µm, a height of 500 Å, and overlap 113 of the cavity 106 by 5.0 µm are provided. Compared to a known DBAR without bridges (depending on frequency of operation, e.g. at 0.87 GHz), an improvement of approximately 400% in $Q_o$ for the DBAR 900 is expected due to the increased confinement of an odd mode in the DBAR 900 by use of first and second bridges 901, 902 of the representative embodiment.

Figure 9B:
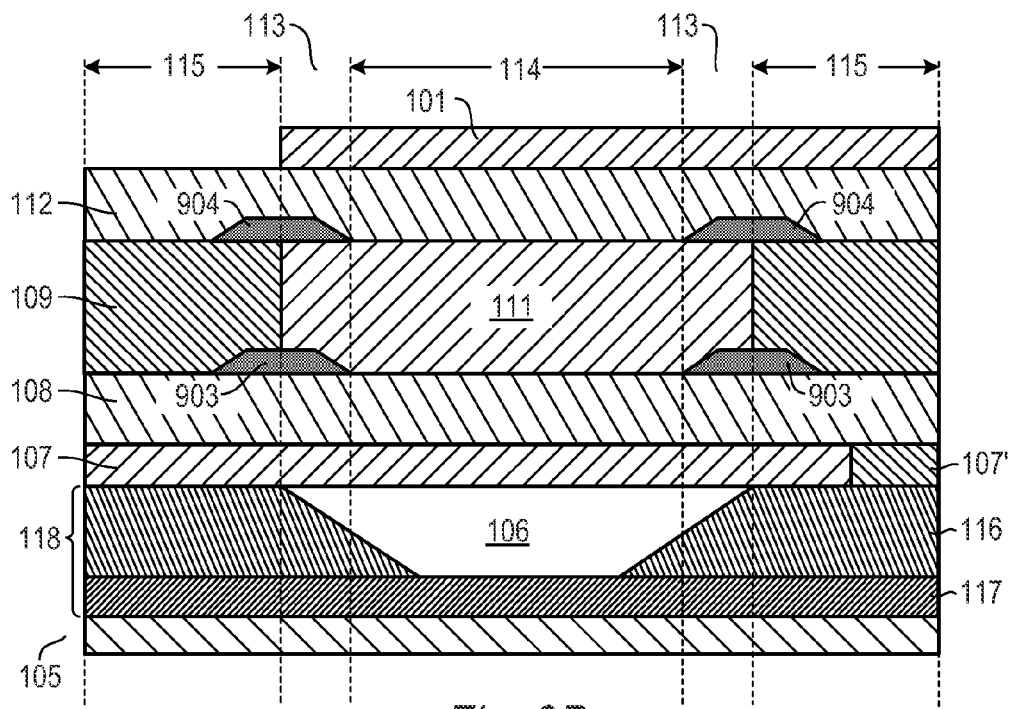

FIG. 9B shows a first bridge 903 provided in the second electrode 111 and extending partially into the planarization layer 109. The first bridge 903 is filled. A second bridge 904 is provided in the second piezoelectric layer 112. The second bridge 904 is filled. First and second bridges 903, 904 are disposed along the perimeter of the active region 114 of the DBAR 900, and foster confinement of modes in the active region 114 of the DBAR 900. For first and second bridges 903, 904 having the same width, height and overlap 113 of cavity 106 as first and second bridges 901, 902 similar improvements in $Q_o$ expected for first and second bridges 901, 902 are expected with the use of first and second bridges 903, 904. Beneficially, the use of a filled bridge provides a more rugged structure.

Figure 9C:
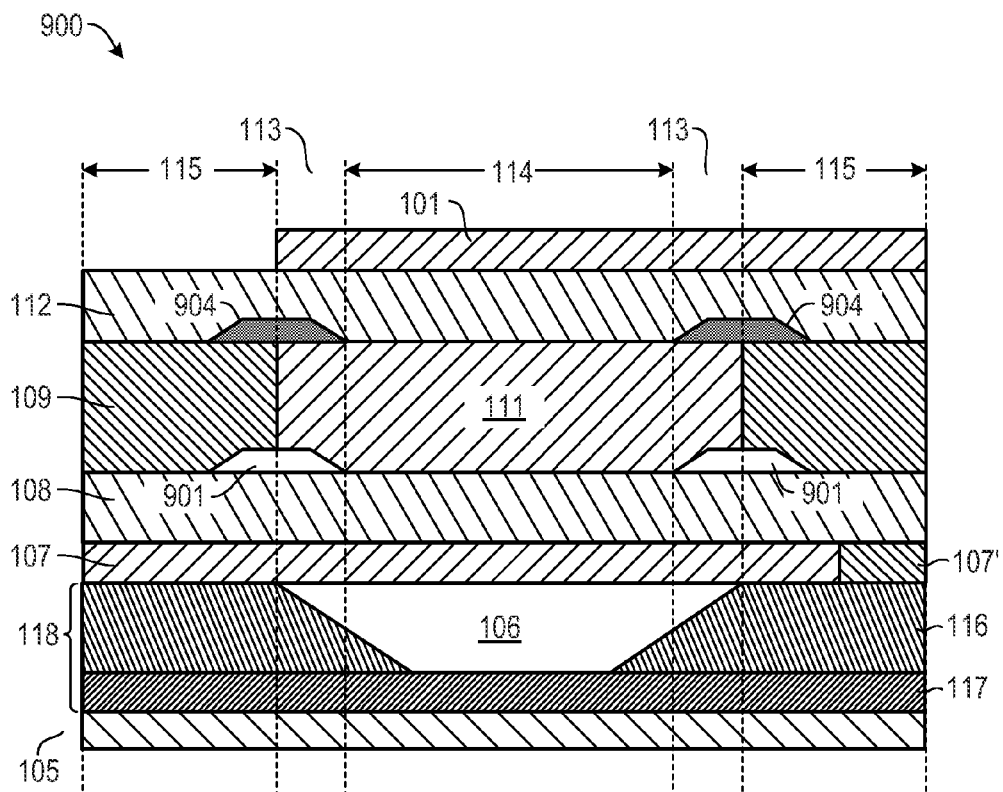

FIG. 9C shows a first bridge 901 provided in the second electrode 111 and extending partially into the planarization layer 109. The first bridge 901 is unfilled (i.e., filled with air).

Second bridge 904 is provided in the second piezoelectric layer 112. The second bridge 904 is filled. First and second bridges 901, 904 are disposed along the perimeter of the active region 114 of the DBAR 900, and foster confinement of modes in the active region 114 of the DBAR 900. For first and second bridges 901, 904 having the same width, height and overlap 113 of cavity 106 as first and second bridges 901, 902 similar improvements in $Q_o$ expected for first and second bridges 901, 902 are expected with the use of first and second bridges 901, 904. Beneficially, the use of a filled bridge provides a more rugged structure.

Figure 9D:
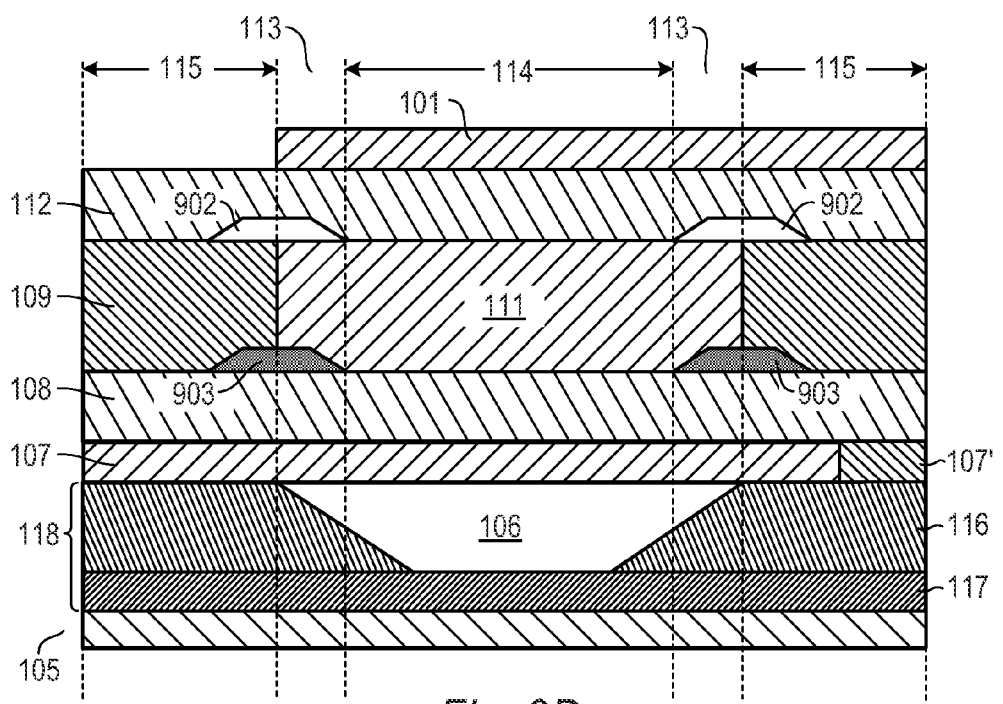

FIG. 9D shows first bridge 903 provided in the second electrode 111 and extending partially into the planarization layer 109. The first bridge 903 is filled. Second bridge 902 is provided in the second piezoelectric layer 112. The second bridge 902 is unfilled (i.e., filled with air). First and second bridges 903, 902 are disposed along the perimeter of the active region 114 of the DBAR 900, and foster confinement of modes in the active region 114 of the DBAR 900. For first and second bridges 903, 902 having the same width, height and overlap 113 of cavity 106 as first and second bridges 901, 902 similar improvements in $Q_o$ expected for first and second bridges 901, 902 are expected with the use of first and second bridges 903, 902. Beneficially, the use of a filled bridge provides a more rugged structure.

FIGS. 10A~10D show cross-sectional views of a DBAR 1000 in accordance with a representative embodiment. The DBAR 1000 comprises a plurality of layers disposed over a substrate 105 having a cavity 106. The DBAR 100 also comprises the DBR 118 described in detail above. Many aspects of the DBAR 1000 are common to those of DBARs 100-900, and are not repeated in order to avoid obscuring the description of the representative embodiments presently described.

Figure 10A:
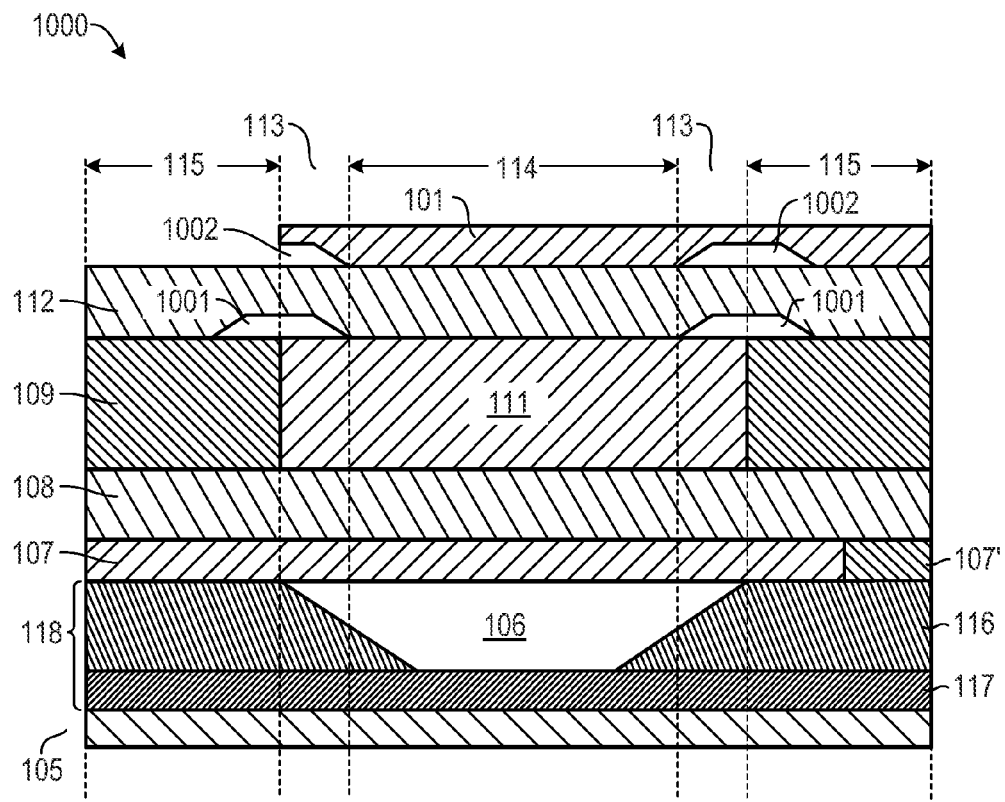
FIGS. 10A~10D are cross-sectional views of DBARs in accordance with a representative embodiment.

FIG. 10A shows a first bridge 1001 provided in the second piezoelectric layer 112. The first bridge 1001 is unfilled (i.e., filled with air). A second bridge 1002 is provided in the third electrode 101. The second bridge 1002 is unfilled (i.e., filled with air). First and second bridges 1001, 1002 are disposed around the perimeter of the active region 114 of the DBAR 1000, and foster confinement of modes in the active region 114 of the DBAR 1000. For purposes of illustration of the improvement in mode confinement in the active region of the DBAR 1000, first and second bridges 1001, 1002 each having a width (x-dimension) of approximately 5.5 µm, a height of 500 Å, and overlap 113 of the cavity 106 by 5.0 µm are provided. Compared to a known DBARs without bridges (depending on frequency of operation, e.g. at 0.87 GHz), an improvement of approximately 400% in $Q_o$ for the DBAR 1000 is expected due to the increased confinement of an odd mode in the DBAR 1000 by use of first and second bridges 1001, 1002 of the representative embodiment.

Figure 10B:
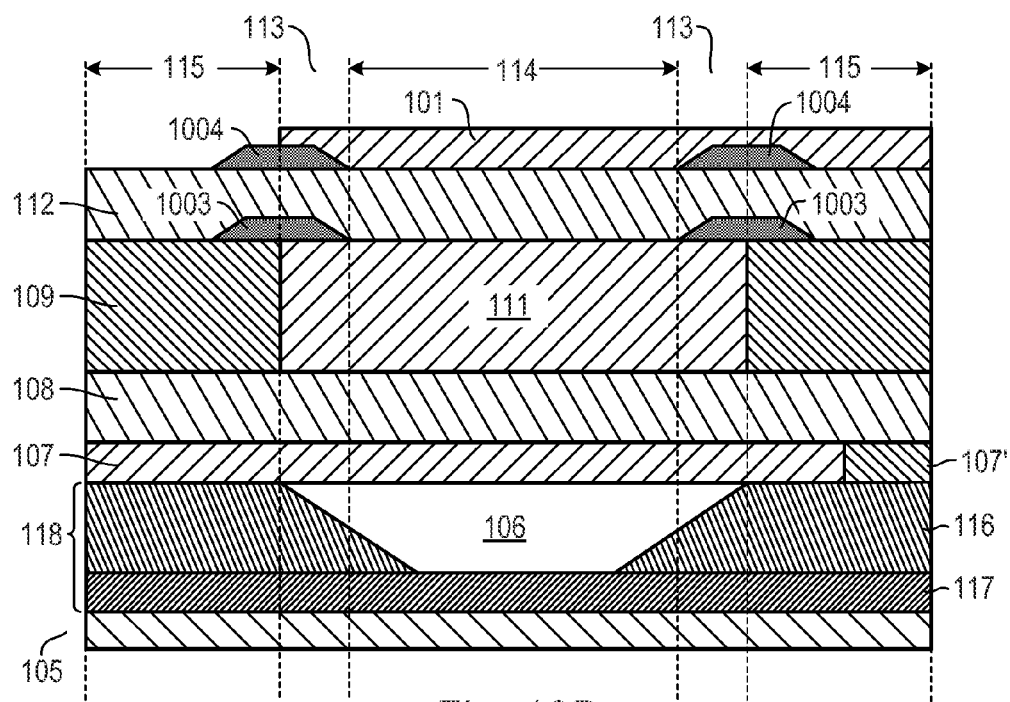

FIG. 10B shows a first bridge 1003 provided in the second piezoelectric layer 112. The first bridge 1003 is filled. A second bridge 1004 is provided in the third electrode 101. The second bridge 1004 is filled. First and second bridges 1003, 1004 are disposed around the perimeter of the active region 114 of the DBAR 1000, and foster confinement of modes in the active region 114 of the DBAR 1000. For first and second bridges 1003, 1004 having the same width, height and overlap 113 of cavity 106 as first and second bridges 1001, 1002 similar improvements in $Q_o$ expected for first and second bridges 1001, 1002 are expected with the use of first and second bridges 1003, 1004. Beneficially, the use of a filled bridge provides a more rugged structure.

Figure 10C:
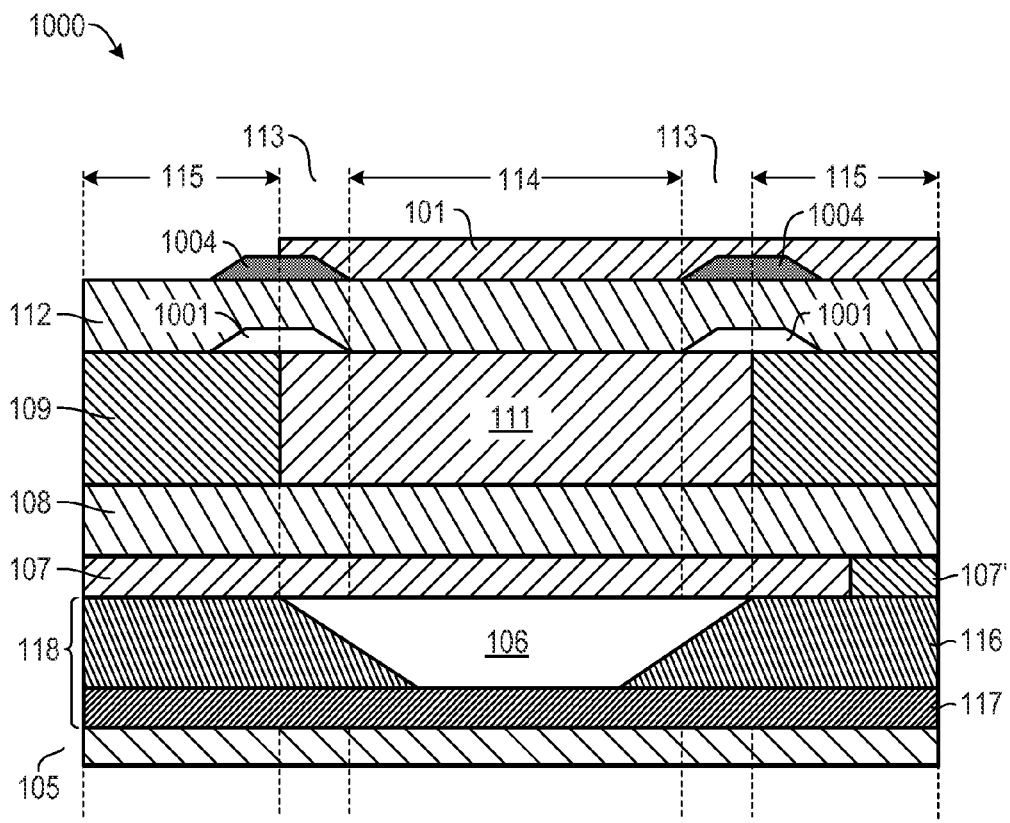

FIG. 10C shows first bridge 1001 provided in the second piezoelectric layer 112. The first bridge 1001 is unfilled (i.e., filled with air). Second bridge 1004 is provided in the third electrode 101. The second bridge 1004 is filled. First and second bridges 1001, 1004 are disposed around the perimeter of the active region 114 of the DBAR 1000, and foster confinement of modes in the active region 114 of the DBAR 1000. For first and second bridges 1001, 1004 having the same width, height and overlap 113 of cavity 106 as first and second bridges 1001, 1002 similar improvements in $Q_o$ expected for first and second bridges 1001, 1002 are expected with the use of first and second bridges 1001, 1004. Beneficially, the use of a filled bridge provides a more rugged structure.

Figure 10D:
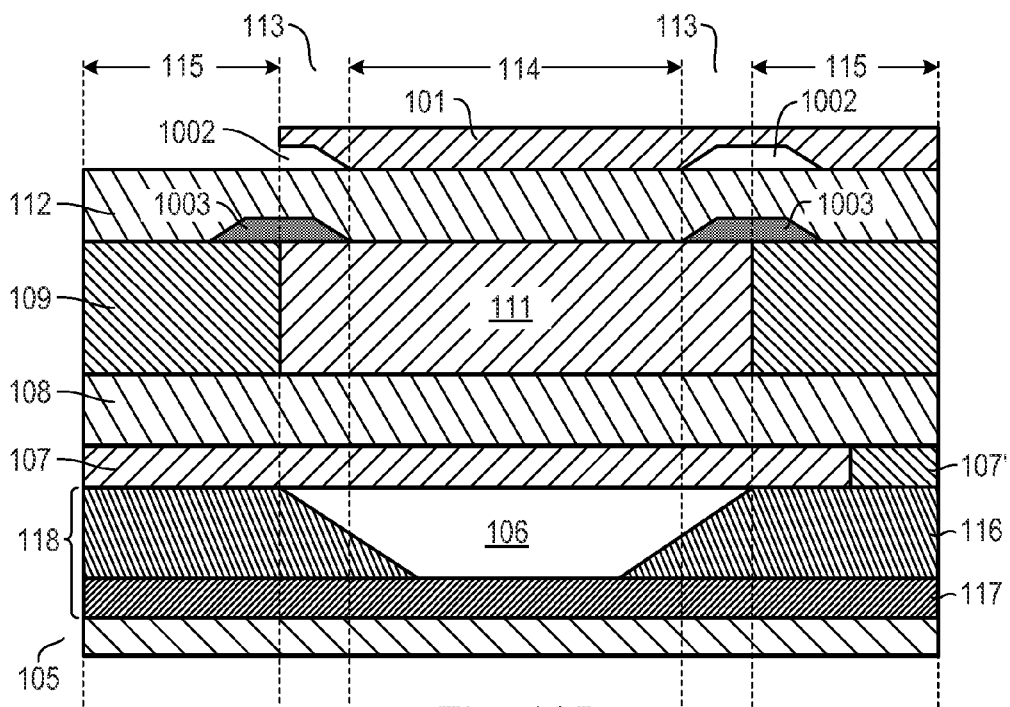

FIG. 10D shows first bridge 1003 provided in the second piezoelectric layer 112. The first bridge 1003 is filled. Second bridge 1002 is provided in the third electrode 101. The second bridge 1002 unfilled (i.e., filled with air). First and second bridges 1003, 1002 are disposed around the perimeter of the active region 114 of the DBAR 1000, and foster confinement of modes in the active region 114 of the DBAR 1000. For first and second bridges 1003, 1002 having the same width, height and overlap 113 of cavity 106 as first and second bridges 1001, 1002 similar improvements in $Q_o$ expected for first and second bridges 1001, 1002 are expected with the use of first and second bridges 1003, 1002. Beneficially, the use of a filled bridge provides a more rugged structure.

Figure 11A:
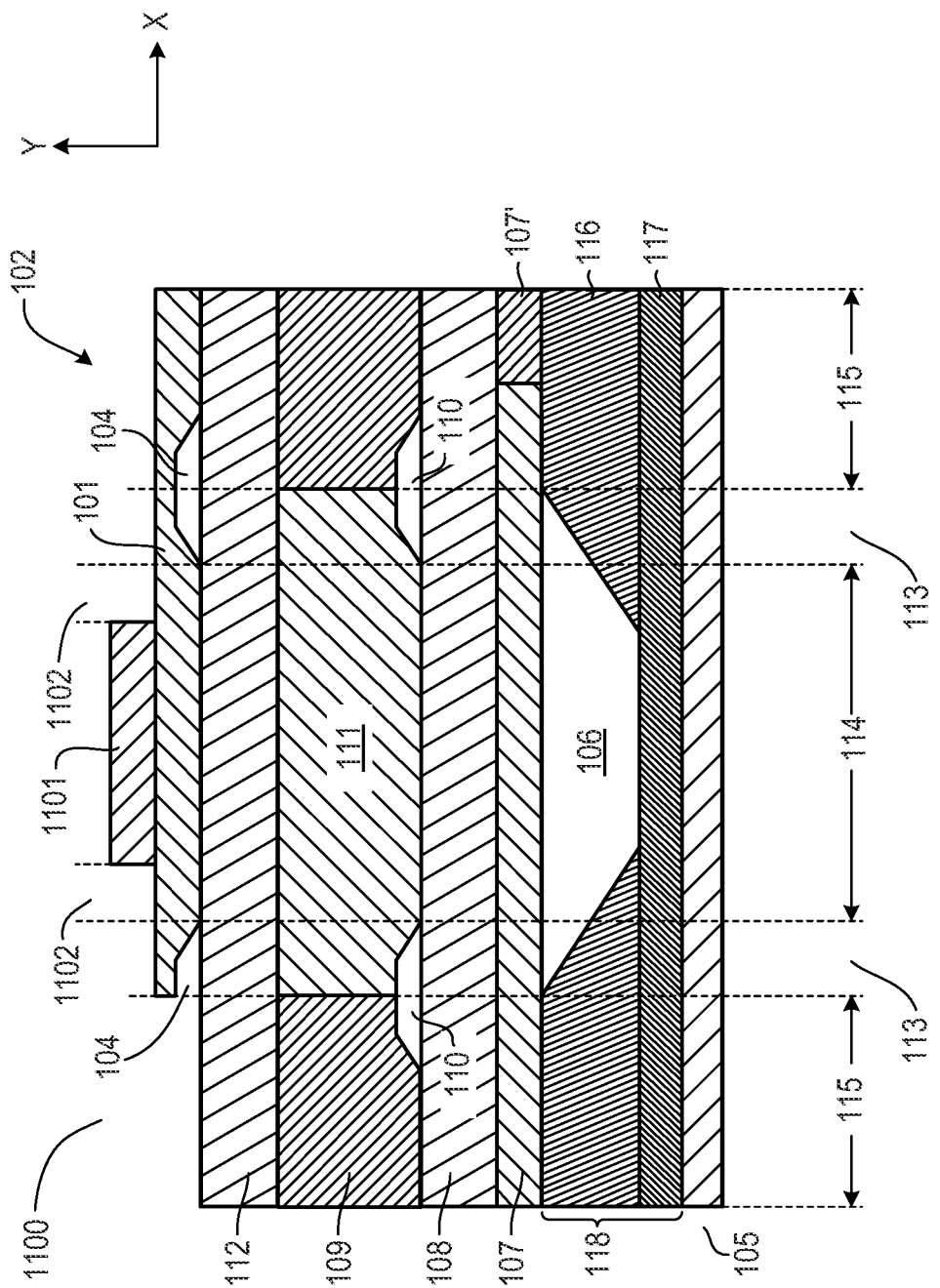
FIGS. 11A~11B are cross-sectional views of DBARs in accordance with a representative embodiment.

FIG. 11A shows a cross-sectional view of a DBAR 1100 in accordance with a representative embodiment. The DBAR 1100 comprises a plurality of layers disposed over a substrate 105 having a cavity 106. The DBAR 1100 also comprises the DBR 118 described in detail above. Many aspects of the DBAR 1100 are common to those of DBARs 100-1000, and are not repeated in order to avoid obscuring the description of the representative embodiments presently described.

FIG. 11A shows first bridge 110 provided in the second electrode 111 and extending into the planarization layer 109. The first bridge 110 is unfilled (i.e., filled with air). Second bridge 104 is provided in the third electrode 101. The second bridge 102 is unfilled (i.e., filled with air). First and second bridges 110, 104 are disposed along the perimeter of the active region 114 of the DBAR 1100, and foster confinement of modes in the active region of the DBAR 1100. Illustratively, first and second bridges 110, 104 each have a width (x-dimension) of approximately 5.5 µm, a height of 500 Å, and overlap 113 the cavity 106 by 5.0 µm.

An inner raised region 1101 is provided over the third electrode 101 in the active region 114. The inner raised region 1101 is separated from the edges of the active region by gaps 1102, each having a width (in the x-dimension of the coordinate system shown in FIG. 11A) of approximately 1.0 µm to approximately 10.0 µm and a thickness (in the y-dimension of the coordinate system shown in FIG. 11A) of approximately 100 Å to approximately 1000 Å, depending on the product performance needs. Many details of the inner raised region 1101 are described in commonly owned U.S. patent application Ser. No. 13/074,094, entitled "Stacked Bulk Acoustic Resonator and Method of Fabricating Same" filed on Mar. 29, 2011, to Alexandre Shirakawa, et al. The disclosure of this U.S. Patent Application is specifically incorporated herein by reference.

Figure 11B:
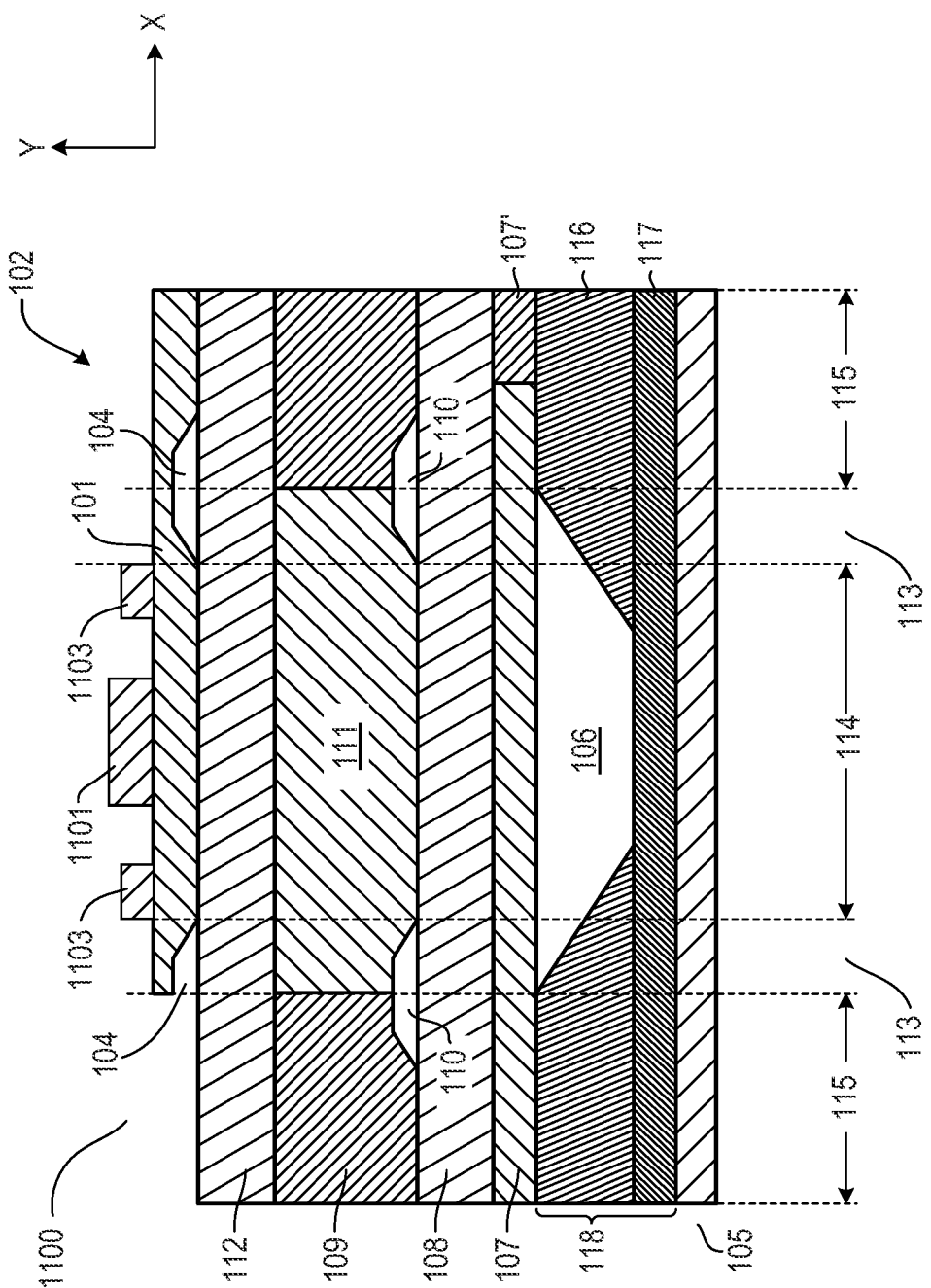

FIG. 11B shows first bridge 110 provided in the second electrode 111 and extending into the planarization layer 109. The first bridge 110 is unfilled (i.e., filled with air). Second bridge 104 is provided in the third electrode 101. The second bridge 102 is unfilled (i.e., filled with air). The DBAR 1100 depicted in FIG. 11B includes inner raised region 1101 and an outer raised region 1103 disposed over the third electrode 101. The outer raised region 1103 abuts the edge of the active region 114 as depicted in FIG. 11B, and has a width (in the x-dimension of the coordinate system shown in FIG. 11B) of approximately 1.0 µm to approximately 10.0 µm and a thickness (in the y-dimension of the coordinate system shown in FIG. 11B) of approximately 500 Å to approximately 5000 Å, depending on the product performance needs. Many details of the outer raised region 1103 are provided in U.S. patent application Ser. No. 13/074,094, entitled "Stacked Bulk Acoustic Resonator and Method of Fabricating Same" filed on Mar. 29, 2011, to Alexandre Shirakawa, et al. and incorporated herein by reference above.

Figure 12:
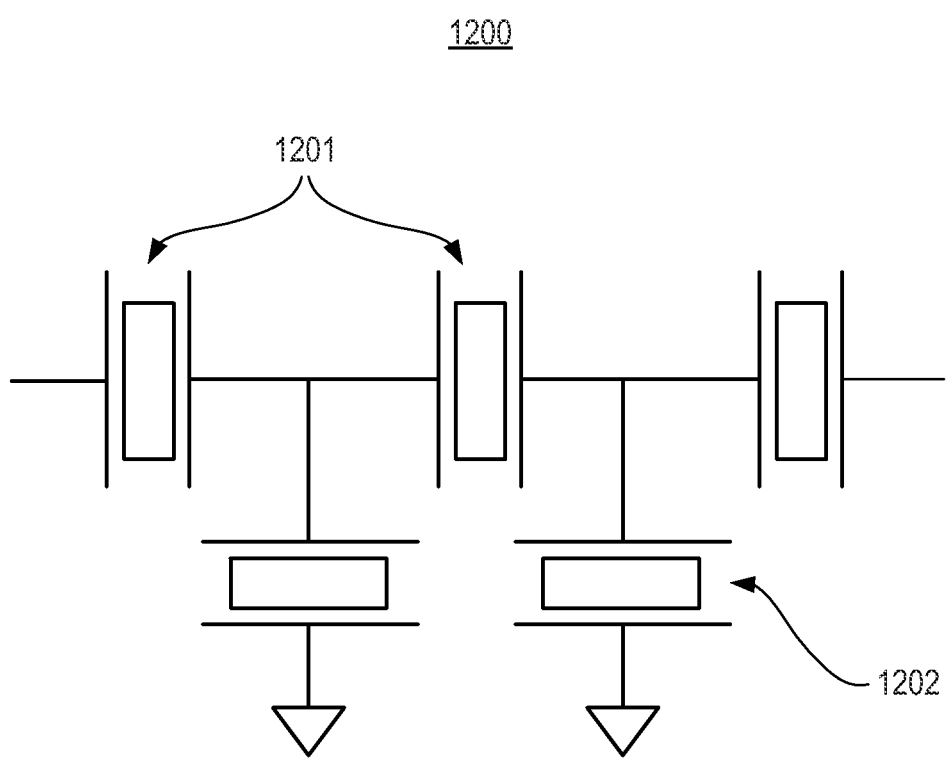
FIG. 12 shows a simplified schematic diagram of an electrical filter in accordance with a representative embodiment.

When connected in a selected topology, a plurality of DBRs according to representative embodiments described above can function as an electrical filter. FIG. 12 depicts a simplified schematic block diagram of an electrical filter 1200 in accordance with a representative embodiment. The electrical filter 1200 comprises series acoustic resonators 1201 and shunt acoustic resonators 1202. Notably, individual DBARs of the representative embodiments described above can be selectively connected to one another, to ground and to input terminals and output terminals to form electrical filter 1200. The electrical filter 1200 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 1200 is merely illustrative and other topologies are contemplated. Moreover, the acoustic resonators of the representative embodiments are contemplated in a variety of applications besides duplexers.

In accordance with illustrative embodiments, BAW resonators comprising bridges and their methods of fabrication are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator, comprising:
a first layer comprising a plurality of sub-layers, wherein a cavity exists in the first layer, the cavity having a perimeter bordering an active region of the BAW resonator;
a distributed Bragg reflector (DBR) bordering the cavity and comprising: the plurality of sub-layers, wherein each of the sub-layers has a thickness substantially equal to an odd multiple of the quarter wavelength of the fundamental eigenmode of the BAW resonator; and a second layer disposed beneath the first layer and the cavity;
a first electrode disposed over the cavity;
a first piezoelectric layer disposed over the first electrode;
a second electrode disposed over the first piezoelectric layer;
a second piezoelectric layer disposed over the second electrode;
a third electrode disposed over the second piezoelectric layer; and
a bridge disposed between the first electrode and the third electrode.

2. A BAW resonator as claimed in claim 1, further comprising a planarization layer disposed adjacent to the second electrode.

3. A BAW resonator as claimed in claim 2, wherein the bridge is disposed partly in the planarization layer and partly in the second electrode.

4. A BAW resonator as claimed in claim 1, wherein the plurality of sub-layers comprise layers having alternating low acoustic impedance and high acoustic impedance relative to one another.

5. A BAW resonator as claimed in claim 4, wherein each of the low acoustic impedance sub-layers comprise first layers of silicon carbide and each of the high acoustic impedance sub-layers comprise second layers of silicon carbide.

6. A BAW resonator as claimed in claim 1, wherein the second layer is a substrate of the BAW resonator.

7. A BAW resonator as claimed in claim 1, further comprising a substrate disposed beneath the second layer of the DBR.

8. A BAW resonator as claimed in claim 1, wherein the bridge is disposed over the distributed Bragg reflector and at least partially overlaps the distributed Bragg reflector.

9. A BAW resonator as claimed in claim 1, wherein the bridge at least partially overlaps the cavity.

10. A RAW resonator as claimed in claim 1, wherein the bridge is a first bridge, and the BAW resonator further comprises a second bridge disposed between the first electrode and the third electrode.

11. A BAW resonator as claimed in claim 10, wherein the BAW resonator has a second perimeter bordering the active region of the BAW resonator, and the second bridge is disposed along the second perimeter.

12. A BAW resonator as claimed in claim 10, wherein the first bridge and the second bridge each comprise a fill material having acoustic impedance.

13. A BAW resonator as claimed in claim 12, wherein the fill material comprises one or more of a dielectric material, a metal, or an alloy of metals.

14. A BAW resonator as claimed in claim 10, wherein the first bridge comprises a fill material having an acoustic impedance and the second bridge comprises air.

15. A BAW resonator as claimed in claim 10, wherein the first bridge is disposed in the first piezoelectric layer and the second bridge is disposed in the second piezoelectric layer.

16. A BAW resonator as claimed in claim 1, wherein the bridge comprises a fill material having an acoustic impedance.

17. A BAW resonator as claimed in claim 16, wherein the fill material comprises one or more of a dielectric material, a metal, or an alloy of metals.

18. A BAW resonator as claimed in claim 1, wherein the bridge has a trapezoidal cross-sectional shape.

19. An electrical filter comprising the BAW resonator as claimed in claim 1.

20. A bulk acoustic wave (BAW) resonator, comprising:
a first layer comprising a plurality of sub-layers, wherein a cavity exists in the first layer, the cavity having a perimeter bordering an active region of the BAW resonator;
a distributed Bragg reflector (DBR) bordering the cavity and comprising: the plurality of sub-layers, wherein each of the sub-layers has a thickness substantially equal to an odd multiple of the quarter wavelength of the fundamental eigenmode of the BAW resonator; and a second layer disposed beneath the first layer and the cavity;
a first electrode disposed over the cavity;
a first piezoelectric layer disposed over the first electrode;
a second electrode disposed over the first piezoelectric layer;

a second piezoelectric layer disposed over the second electrode;

a third electrode disposed over the second piezoelectric layer;

a bridge disposed between the first electrode and the third electrode; and an inner raised region disposed over the third electrode, or an outer raised region disposed over the third electrode, or both the inner raised region and the outer raised region.

21. A BAW resonator as claimed in claim 20, further comprising a planarization layer disposed adjacent to the second electrode.

22. A BAW resonator as claimed in claim 21, wherein the bridge is disposed partly in the planarization layer and partly in the second electrode.

23. A BAW resonator as claimed in claim 20, wherein the plurality of sub-layers comprise sub-layers having alternating low acoustic impedance and high acoustic impedance relative to one another.

24. A BAW resonator as claimed in claim 23, wherein each of the sub-layers having low acoustic impedance comprise first layers of silicon carbide and each of the sub-layers having high acoustic impedance comprise second layers of silicon carbide.

25. A BAW resonator as claimed in claim 20, wherein the second layer is a substrate of the BAW resonator.

26. A BAW resonator as claimed in claim 20, further comprising a substrate disposed beneath the second layer of the DBR.

27. A BAW resonator as claimed in claim 20, wherein the bridge is disposed over the distributed Bragg reflector and at least partially overlaps the distributed Bragg reflector.

28. A BAW resonator as claimed in claim 20, wherein the bridge at least partially overlaps the cavity.

29. A BAW resonator as claimed in claim 20, wherein the bridge is a first bridge, and the BAW resonator further comprises a second bridge disposed between the first electrode and the third electrode.

30. A BAW resonator as claimed in claim 29, wherein the BAW resonator has a second perimeter bordering the active region of the BAW resonator, and the second bridge is disposed along the second perimeter.

31. A BAW resonator as claimed in claim 29, wherein the first bridge is disposed in the first piezoelectric layer and the second bridge is disposed in the second piezoelectric layer.

32. An electrical filter comprising the BAW resonator as claimed in claim 20.

33. A bulk acoustic wave (BAW) resonator, comprising:
a cavity provided in a first layer and having a perimeter bordering an active region of the BAW resonator;
a distributed Bragg reflector (DBR) bordering the cavity, the DBR comprising the first layer and a second layer, wherein the first layer comprises a low acoustic impedance layer comprising a first layer of silicon carbide and the second layer comprises a high acoustic impedance layer comprising a second layer of silicon carbide;
a first electrode disposed over the cavity;
a first piezoelectric layer disposed over the first electrode;
a second electrode disposed over the first piezoelectric layer;
a second piezoelectric layer disposed over the second electrode;
a third electrode disposed over the second piezoelectric layer; and
a bridge disposed between the first electrode and the third electrode.

34. A BAW resonator as claimed in claim 33, further comprising a substrate disposed beneath the second layer of the DBR.

35. A BAW resonator as claimed in claim 33, wherein the bridge is disposed over the distributed Bragg reflector and at least partially overlaps the distributed Bragg reflector.

36. A BAW resonator as claimed in claim 35, wherein the BAW resonator has a second perimeter bordering the active region of the BAW resonator, and a second bridge is disposed along the second perimeter.

37. A BAW resonator as claimed in claim 33, wherein the bridge at least partially overlaps the cavity.

38. A BAW resonator as claimed in claim 33, wherein the bridge is a first bridge, and the BAW resonator further comprises a second bridge disposed between the first electrode and the third electrode.

39. A BAW resonator as claimed in claim 38, wherein the first bridge and the second bridge each comprise a fill material having acoustic impedance.

40. A BAW resonator as claimed in claim 39, wherein the fill material comprises one or more of a dielectric material, a metal, or an alloy of metals.

41. A BAW resonator as claimed in claim 33, wherein the first layer of the DBR comprises a plurality of sub-layers wherein each of the sub-layers has a thickness substantially equal to an odd multiple of the quarter wavelength of the fundamental eigenmode of the BAW resonator.

* * * * *